United States Patent
Ifuku et al.

(10) Patent No.: US 9,252,685 B2
(45) Date of Patent: Feb. 2, 2016

(54) DUST REMOVING DEVICE AND IMAGING DEVICE

(71) Applicant: CANON KABUSHIKI KAISHA, Tokyo (JP)

(72) Inventors: Toshihiro Ifuku, Yokohama (JP); Yasushi Shimizu, Fujisawa (JP); Tatsuo Furuta, Machida (JP); Takanori Matsuda, Chofu (JP); Makoto Kubota, Yokohama (JP); Jumpei Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/344,396

(22) PCT Filed: Oct. 19, 2012

(86) PCT No.: PCT/JP2012/077666
§ 371 (c)(1),
(2) Date: Mar. 12, 2014

(87) PCT Pub. No.: WO2013/058410
PCT Pub. Date: Apr. 25, 2013

(65) Prior Publication Data
US 2014/0218588 A1 Aug. 7, 2014

(30) Foreign Application Priority Data

Oct. 20, 2011 (JP) .................................. 2011-230368
Mar. 16, 2012 (JP) .................................. 2012-060202
Aug. 9, 2012 (JP) .................................. 2012-177562
Aug. 29, 2012 (JP) .................................. 2012-188984

(51) Int. Cl.
*H02N 2/00* (2006.01)
*H04N 5/357* (2011.01)
(Continued)

(52) U.S. Cl.
CPC ................ *H02N 2/001* (2013.01); *B08B 7/028* (2013.01); *G02B 27/0006* (2013.01); *H04N 5/357* (2013.01); *H01L 41/1871* (2013.01); *H04N 5/2254* (2013.01)

(58) Field of Classification Search
None
See application file for complete search history.

(56) References Cited

U.S. PATENT DOCUMENTS 7,482,736 B2 1/2009 Ueno et al.
7,786,656 B2 8/2010 Sakashita et al.
(Continued)

FOREIGN PATENT DOCUMENTS

CN 1979908 A 6/2007
CN 101295762 A 10/2008
(Continued)

OTHER PUBLICATIONS

Saburo Nagakura et al. (ed.), Iwanami Dictionary of Physics and Chemistry, 5th Edition, p. 1268-1269 (Iwanami Shoten, Publishers; Feb. 20, 1998).
(Continued)

*Primary Examiner* — Albert Cutler
(74) *Attorney, Agent, or Firm* — Fitzpatrick, Cella, Harper & Scinto

(57) ABSTRACT

Provided is a dust removing device that can be designed and controlled appropriately and has high dust removal performance even at low temperature, and an imaging device using the dust removing device. In a dust removing device to be set on a base, including a piezoelectric element formed of a piezoelectric material and a pair of opposing electrodes, a vibration member, and a fixation member containing at least a high molecular compound component, a phase transition temperature T from a first ferroelectric crystal phase to a second ferroelectric crystal phase of the piezoelectric material is set to $-60° C. \leq T \leq -5° C.$, and whereby, the dust removing device can be designed and controlled appropriately and high dust removal performance can be obtained even at low temperature.

14 Claims, 14 Drawing Sheets

(51) Int. Cl.
*B08B 7/02* (2006.01)
*G02B 27/00* (2006.01)
*H04N 5/225* (2006.01)
*H01L 41/187* (2006.01)

(56) References Cited

U.S. PATENT DOCUMENTS

| | | | |
|---|---|---|---|
| 7,906,889 B2 | 3/2011 | Furuta et al. | |
| 8,034,250 B2 | 10/2011 | Hayashi et al. | |
| 8,063,973 B2 | 11/2011 | Niwamae | |
| 8,189,099 B2 | 5/2012 | Kawai | |
| 8,525,658 B2 | 9/2013 | Hirabayashi et al. | |
| 2008/0265718 A1* | 10/2008 | Sakashita et al. | 310/358 |
| 2008/0308762 A1 | 12/2008 | Ueno et al. | |
| 2010/0013894 A1 | 1/2010 | Ueno et al. | |
| 2010/0231780 A1* | 9/2010 | Kawai | 348/335 |
| 2011/0074564 A1* | 3/2011 | Hirabayashi et al. | 340/447 |
| 2012/0019108 A1 | 1/2012 | Tanaka et al. | |
| 2013/0056671 A1 | 3/2013 | Kubota et al. | |
| 2013/0241347 A1 | 9/2013 | Suzuki et al. | |
| 2013/0270965 A1 | 10/2013 | Hayashi et al. | |

FOREIGN PATENT DOCUMENTS

| | | |
|---|---|---|
| CN | 101840132 A | 9/2010 |
| CN | 102035431 A | 4/2011 |
| DE | 10-2004-063818 A1 | 7/2006 |
| EP | 1 796 266 A2 | 6/2007 |
| EP | 1 986 245 A2 | 10/2008 |
| EP | 2 228 982 A1 | 9/2010 |
| EP | 2 301 770 A2 | 3/2011 |
| JP | 2007-259700 A | 10/2007 |
| JP | 2009-010736 A | 1/2009 |
| JP | 2010-269983 A | 12/2010 |
| JP | 4790056 B2 | 10/2011 |
| KR | 10-2011-0034559 A | 4/2011 |

OTHER PUBLICATIONS

Office Action in Chinese Application No. 201280050599.9 (issued Dec. 29, 2014).

Notice of Preliminary Rejection in Korean Application No. 10-2014-7012657 (mailed Nov. 12, 2015).

* cited by examiner

DUST REMOVING DEVICE AND IMAGING DEVICE

TECHNICAL FIELD

The present invention relates to removing dust adhering to a surface of an imaging device such as a digital camera or a video camera and an optical component incorporated in the imaging device, and more particularly, to a dust removing device for removing dust through application of vibration.

BACKGROUND ART

In an imaging device such as a digital camera for picking up an image by converting an image signal into an electric signal, a photographing light flux is received by an image pickup element such as a charge coupled device (CCD) or a complementary metal oxide semiconductor (CMOS). Then, a photoelectric conversion signal output from the image pickup element is converted into image data, and the image data is recorded on a recording medium such as a memory card. In such an imaging device, an optical low-pass filter and an infrared cut filter are disposed in front (on a subject side) of the image pickup element.

In the imaging device of this type, when dust adheres to a surface of a cover glass of the image pickup element or to surfaces of those filters, the dust may appear as a black spot in the picked-up image. In particular, in a single-lens reflex digital camera which includes an interchangeable lens, dust may enter the digital camera main body through the opening of the lens mount when the lens is being changed, and may adhere to the surfaces of the cover glass of the image pickup element or of the filters.

In view of the above, there has been proposed a digital camera which includes a dust removing device for removing dust adhering to the surface by using a vibration of a piezoelectric element (see, for example, PTL 1).

In the dust removing device included in the digital camera disclosed in PTL 1, an alternating voltage having a predetermined frequency is applied to a piezoelectric element fixedly bonded to a vibration member (dust filter in PTL 1) so as to drive the piezoelectric element, to thereby generate elastic vibration (hereinafter, defined as flexural vibration) for causing a displacement of the vibration member in an optical axis direction, that is, in a thickness direction of the vibration member. The dust removing device of PTL 1 removes dust adhering to the surface of the vibration member through application of the flexural vibration thus generated.

In the digital camera of PTL 1 having the above-mentioned configuration, a front surface side of the vibration member is held by a pushing member one end of which is fixed to a camera main body (imaging device) by a screw, and a rear surface side of the vibration member is held by a seal provided on the camera main body (imaging device). On the rear surface side of the vibration member, a sealed state is ensured by the vibration member, the seal, and the camera main body (a sealed space for preventing a foreign matter such as dust from entering therein is formed), and hence, dust is not projected on a picked up image only if dust on the front surface side of the vibration member can be removed.

In this case, the vibration member is pushed against the seal with a pressure from the pushing member. The pushing member made of a plate material of phosphor bronze for a spring or stainless steel for a spring has high bending stiffness, and the seal made of a rubber material has low bending stiffness, and hence, the seal is deformed with a pressure or an external force (inertia force, etc.).

Further, a receiving member bonded to the pushing member is interposed between the pushing member and the vibration member, and the receiving member receives the vibration member through the intermediation of a positioning member to position the vibration member in a plane perpendicular to an optical axis. The receiving member and the positioning member are made of materials having vibration damping such as rubber and a resin.

Further, a receiving portion is set on the rear surface side of the vibration member. The stiffness of the receiving portion having vibration damping, made of rubber, a soft resin, or the like, is higher than that of the seal, and hence, the seal is prevented from being deformed with respect to a certain pressure or more of the vibration member.

Incidentally, the receiving portion is arranged so as to support a node of the vibration member in which flexural vibration hardly occurs so as not to inhibit the vibration of the vibration member.

A piezoelectric element fixedly bonded to the vibration member is electrically connected to a flexible printed board for applying the alternating voltage having the predetermined frequency to the piezoelectric element, and this connection is performed generally through adhesion with an anisotropic conductive film (ACF) or a resin.

As described above, the dust removing device requires a fixation member for setting the dust removing device on a base such as an imaging device or a camera main body. The fixation member requires damping ability, as its function, so as not to transmit excess vibration to the base. On the other hand, as shown in a series of configurations as in PTL 1, the fixation member has an aspect of remarkably inhibiting the vibration of the vibration member to degrade the effect of removing dust. Therefore, a soft high molecular compound material such as rubber or a resin is used for the fixation member.

Further, in the dust removing device, a soft material such as a resin is used also for fixed bonding between the piezoelectric element and the vibration member and adhesion between the piezoelectric element and the flexible printed board.

The piezoelectric element of PTL 1 is in the form of a plate having a ring shape or a rectangular shape, and includes a piezoelectric material and a pair of electrodes opposed to each other. The pair of electrodes includes a first electrode and a second electrode which are disposed on plate surfaces of the piezoelectric material. The first electrode is also called lower electrode, and the second electrode is also called upper electrode. Here, an expanding and contracting distortion is generated in the piezoelectric material by an electric field applied between the electrodes, which generates an elastic vibration (hereinafter, defined as length vibration) for causing a displacement of the piezoelectric element of PTL 1 in a direction perpendicular to the optical axis of the vibration member, that is, in a direction (hereinafter, defined as length direction) perpendicular to the thickness direction of the piezoelectric element. Due to the length vibration of the piezoelectric element, a stress is generated between the piezoelectric element and the vibration member fixedly bonded to the piezoelectric element, to thereby generate a flexural vibration in the vibration member.

In the vibration member, a voltage to be applied to the piezoelectric element is controlled in frequency or phase so that the flexural vibration of the vibration member may generate a standing wave of multiple orders, which is called vibration modes, having multiple node portions and antinode portions, or a traveling wave which has node portions and antinode portions and moves in a length direction of the vibration member with respect to time. For example, in the dust removing device included in the digital camera disclosed in PTL 1, a pair of the piezoelectric elements are applied with voltages which are controlled in phase so that multiple vibration modes may be generated, and the multiple vibration modes are selectively used effectively, to thereby effectively remove dust adhering to a surface of the vibration member.

Here, the dust removing device of PTL 1 is driven at a frequency in proximity to the resonance frequency of the vibration member, and hence a larger flexural vibration may be generated in the vibration member even when a smaller voltage is applied to the piezoelectric element.

Further, the dust removing device of PTL 1 is configured so as to remove dust without any problem with respect to an individual variation of the dust removing device and a fluctuation in frequency with respect to temperature, by sweeping a frequency band in the vicinity of a resonance frequency. According to PTL 1, the frequency for oscillating the piezoelectric element is determined by the shape, size and material, and the support state of the piezoelectric element and a vibrator formed of a vibration member, and generally, the temperature is one factor for influencing the coefficient of elasticity of the vibrator and changing the resonance frequency thereof. Thus, the temperature is one factor for changing the resonance frequency of the vibrator and the dust removing device.

The magnitude of length vibration of the piezoelectric element is closely related to the magnitude of piezoelectric displacement caused by a traverse piezoelectric effect of a piezoelectric ceramics, and hence, a piezoelectric element excellent in piezoelectric characteristics is chosen.

Meanwhile, the piezoelectric element which is currently used in various devices uses a piezoelectric material containing a large amount of lead, such as lead zirconate titanate (PZT: $PbZr_{1-x}Ti_xO_3$) containing lead, in many cases. For example, the piezoelectric element of PTL 1 uses lead zirconate titanate. However, it has been pointed out that such a piezoelectric material made of lead zirconate titanate containing a large amount of lead can be detrimental to ecosystems because the lead component in the piezoelectric material seeps into soil when the piezoelectric material is once discarded to be exposed to acid rain, for example. In view of this, in recent years, with consideration given to the environment and to comply with laws restricting the use of lead in various products, a piezoelectric material (lead-free piezoelectric material) containing no lead or a minimum amount of lead and product development therefor are under study and consideration. However, a prominent lead-free piezoelectric material having various properties equivalent to those of lead zirconate titanate has not been realized, and there are still only a few examples of commercialized devices using a lead-free piezoelectric material which is equivalent in quality to lead zirconate titanate.

CITATION LIST

Patent Literature

PTL 1: Japanese Patent No. 04790056

Non Patent Literature

NPL 1: Iwanami Dictionary of Physics and Chemistry, 5th Edition (Iwanami Shoten, Publishers, published on Feb. 20, 1998)

SUMMARY OF INVENTION

Technical Problem

As described above, the dust removing device provided in a digital camera of PTL 1 is capable of generating flexural vibration in the vibration member by generating length vibration of the piezoelectric element and removing dust adhering to the surface of the vibration member through the flexural vibration.

However, the vibration to be generated in the piezoelectric element is length vibration, and hence, the entire vibration member and piezoelectric element are subjected to flexural vibration in a certain vibration mode. Therefore, a fixation member for setting the dust removing device on a base such as an imaging device or a camera main body is required. The fixation member requires, as its function, damping ability so as not to transmit excessive vibration to the base. On the other hand, the fixation member has an aspect of remarkably inhibiting the vibration of the vibration member to degrade the effect of removing dust. Therefore, a high molecular compound material such as rubber or a resin is used for the fixation member so as not to remarkably inhibit the vibration of the vibration member.

Further, in the dust removing device, a soft high molecular compound material such as a resin is used also for fixed bonding between the piezoelectric element and the vibration member and adhesion between the piezoelectric element and the flexible printed board.

In general, a member that does not inhibit the vibration of the vibration member and does not transmit excess vibration to a base such as an imaging device or a camera main body, that is, a member most excellent in damping ability, is a rubber-like resin having a glass transition temperature in a low temperature range. However, such a material generally has a glass transition temperature in the vicinity of room temperature, and hence, the material is remarkably cured as the temperature declines and the coefficient of elasticity of the material increases. Therefore, in the conventional dust removing device as disclosed in PTL 1, the driving frequency of the dust removing device increases along with a decrease in temperature, and it is necessary to enlarge a sweeping frequency band of the dust removing device in advance so as to remove dust without any problem at an assumed use temperature. Further, it is necessary to remove dust through use of another elastic vibration in a low temperature range so as to avoid the problem of enlarging the sweeping frequency band in advance. Thus, it is difficult to design or control the dust removing device appropriately.

Further, the conventional dust removing device as disclosed in PTL 1 has a problem in that the material is remarkably cured along with a decrease in temperature to inhibit the vibration of the vibration member, and hence, the amplitude of the vibration member becomes smaller along with a decrease in temperature to degrade the performance of removing dust.

In particular, in a rectangular dust removing device, even when dust is removed with one vibration mode, the fixation member cannot be prevented from coming into contact with a site other than a node of the vibration member. Therefore, it is more difficult to design and control the dust removing device appropriately and to keep the high performance of removing dust at low temperature, compared with a circular dust removing device.

The present invention has been made so as to solve the above-mentioned problems, and it is an object of the present invention to provide a dust removing device that is capable of being designed and controlled appropriately and that has high performance of removing dust even at low temperature, and an imaging device using the dust removing device.

Solution to Problem

In order to solve the above-mentioned problem, there is provided a dust removing device to be set on a base, including: a piezoelectric element including a piezoelectric material and a pair of opposing electrodes; a vibration member; and a fixation member containing at least a high molecular compound component, in which a phase transition temperature T from a first ferroelectric crystal phase to a second ferroelectric crystal phase of the piezoelectric material is −60° C.≤T≤−5° C.

In order to solve the above-mentioned problem, there is also provided an imaging device including an image pickup element unit and a dust removing device to be set on a base, the dust removing device including a piezoelectric element formed of a piezoelectric material and a pair of opposing electrodes, a vibration member, and a fixation member containing at least a high molecular compound component, in which a phase transition temperature T from a first ferroelectric crystal phase to a second ferroelectric crystal phase of the piezoelectric material is −60° C.≤T≤−5° C., and the vibration member of the dust removing device and a light-receiving surface of the image pickup element unit are provided coaxially in this order.

Advantageous Effects of Invention

According to the present invention, a dust removing device capable of being designed and controlled appropriately and an imaging device using the dust removing device can be provided. Further, a dust removing device having high performance of removing dust even at low temperature and an imaging device using the dust removing device can be provided.

Further features of the present invention will become apparent from the following description of exemplary embodiments with reference to the attached drawings.

DESCRIPTION OF EMBODIMENTS

Embodiments for carrying out the present invention are described below.

A dust removing device according to the present invention is a dust removing device to be set on a base, including a piezoelectric element formed of a piezoelectric material and a pair of opposing electrodes, a vibration member, and a fixation member containing at least a high molecular compound component, in which a phase transition temperature T from a first ferroelectric crystal phase of the piezoelectric material to a second ferroelectric crystal phase thereof is −60° C.≤T≤−5° C.

An imaging device according to the present invention is an imaging device including an image pickup element unit and a dust removing device to be set on a base, the dust removing device including a piezoelectric element formed of a piezoelectric material and a pair of opposing electrodes, a vibration member, and a fixation member containing at least a high molecular compound component, in which a phase transition temperature T from a first ferroelectric crystal phase of the piezoelectric material to a second ferroelectric crystal phase thereof is −60° C.≤T≤−5° C., and the vibration member of the dust removing device and a light-receiving surface of the image pickup element unit are provided coaxially in this order.

First, a dust removing device according to an exemplary embodiment of the present invention is described.

Figures 1A, 1B, 1C:
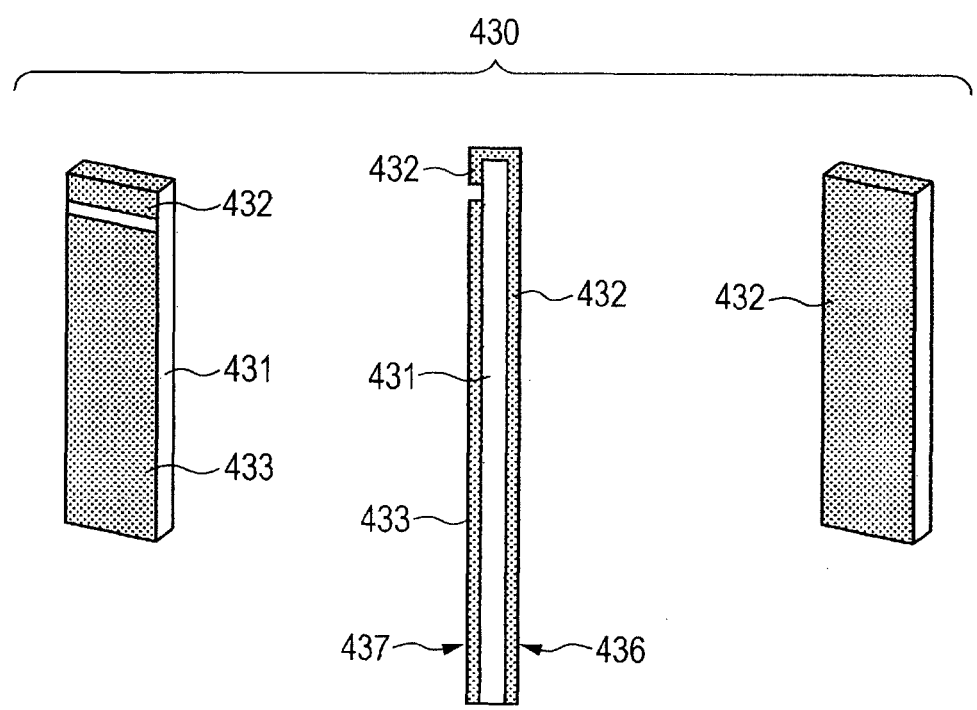
FIGS. 1A, 1B, and 1C are views illustrating an example of a piezoelectric element of the present invention.

FIGS. 1A to 1C are views illustrating an example of a piezoelectric element 430 of the dust removing device of the present invention. The piezoelectric element 430 is formed of a piezoelectric material 431, a first electrode 432, and a second electrode 433, and the first electrode 432 and the second electrode 433 are arranged so as to be opposed to a plate surface of the piezoelectric material 431. A surface of the piezoelectric element 430, on which the first electrode 432 illustrated on the front side of FIG. 1C is set, is a first electrode surface 436. A surface of the piezoelectric element 430, on which the second electrode 433 illustrated on the front side of FIG. 1A is set, is a second electrode surface 437. In this case, the electrode surface in the present invention refers to a surface of the piezoelectric element on which the electrode is set, and for example, as illustrated in FIGS. 1A to 1C, the first electrode 432 may be bent to cover the second electrode surface 437 partially. Further, a third electrode or the like used for sensing may be present on the second electrode surface 437. In the subsequent drawings, the same reference numerals as those in FIGS. 1A to 1C denote the same constituent elements.

Figure 2:
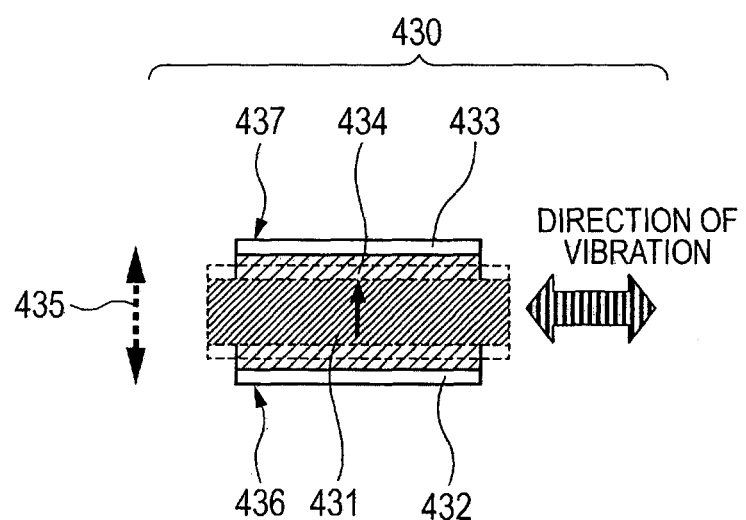
FIG. 2 is a view illustrating an example of the vibration principle of the piezoelectric element of the present invention.

FIG. 2 is a view illustrating an example of the operation principle of the piezoelectric element 430 of the dust removing device of the present invention. The piezoelectric element 430 is designed in such a manner that the piezoelectric material 431 is polarized in a direction perpendicular to the first electrode surface 436 in advance, and hence a high frequency voltage can be applied from a power source to the first electrode 432 and the second electrode 433. In the piezoelectric element 430, length vibration is generated in the longitudinal direction of the piezoelectric element 430 due to the length distortion of the piezoelectric material 431 caused by an alternating electric field generated in a direction indicated by an arrow of an electric field direction 435. The magnitude of the length vibration of the piezoelectric element is closely related to the magnitude of piezoelectric displacement caused by the transverse piezoelectric effect of a piezoelectric ceramics. Note that, reference numeral 434 represents the polarization direction.

The first electrode 432 and the second electrode 433 are each formed of a conductive layer having a thickness of about 5 nm to 5,000 nm. The material for the conductive layer is not particularly limited, and may be a material which is typically used in a piezoelectric element. Examples of such material include metals such as Ti, Pt, Ta, Ir, Sr, In, Sn, Au, Al, Fe, Cr, Ni, Pd, Ag, and Cu, and compounds of these metals.

Each of the first electrode 432 and the second electrode 433 may be formed of one kind of those materials, or may be obtained by laminating two or more kinds thereof. The first electrode 432 and the second electrode 433 may be formed of different materials, respectively.

Figure 3:
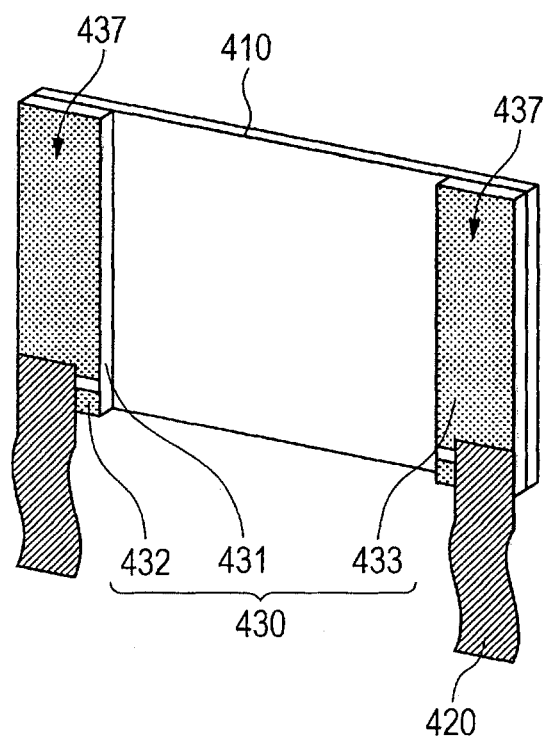
FIG. 3 is a view illustrating an example of a dust removing device of the present invention.
Figure 4A:
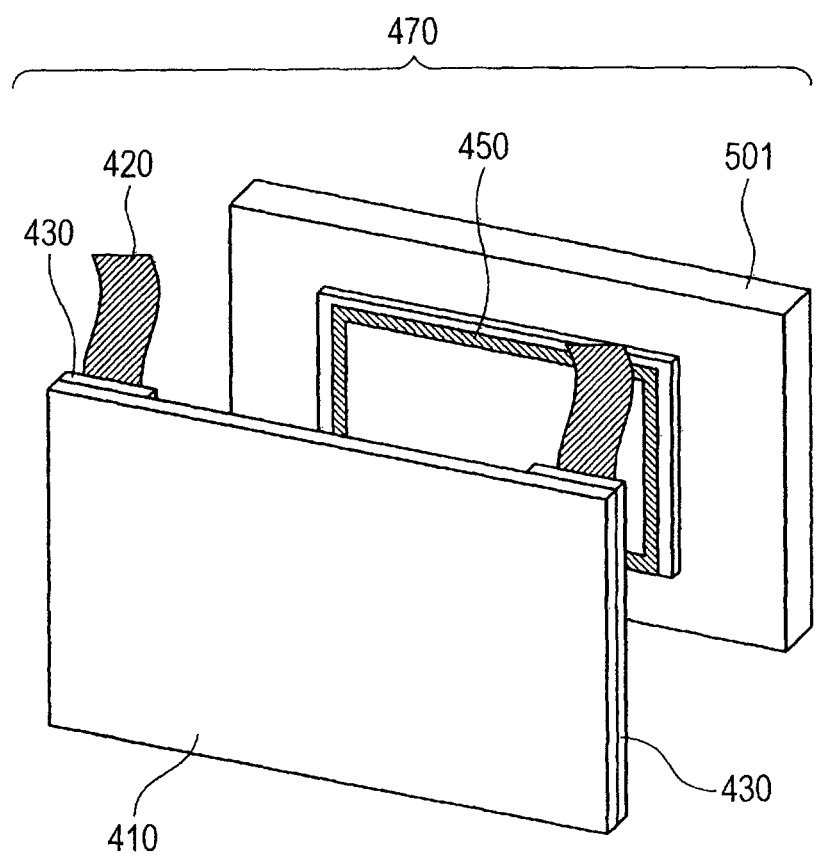
FIGS. 4A and 4B are views illustrating an example of the dust removing device of the present invention.
Figure 4B:
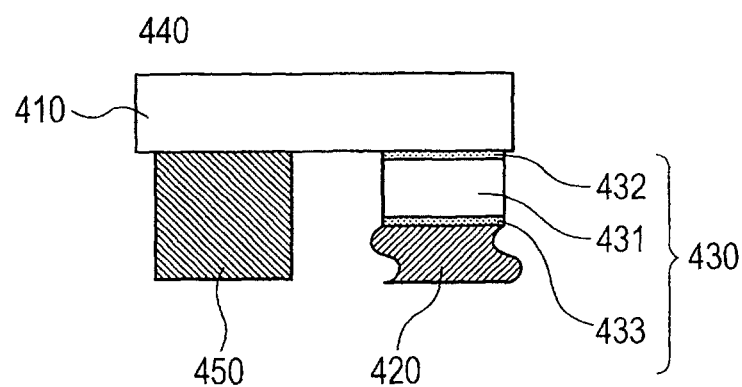

FIG. 3 and FIGS. 4A and 4B are schematic views illustrating an example of a dust removing device 470 of the present invention.

The dust removing device 470 includes a vibration member 410, a flexible printed board 420 connected to the piezoelectric element, a piezoelectric element 430, and a fixation member called a sealing member 450, and is set on a base 501.

As illustrated in FIG. 3, the piezoelectric element 430 and the vibration member 410 are fixedly bonded to a plate surface of the vibration member 410 through the first electrode surface 436 of the piezoelectric element 430. Further, the flexible printed board 420 is electrically connected to a part of the second electrode surface 437 of the piezoelectric element 430 so that an alternating voltage can be applied from a power source to the piezoelectric element 430.

Figure 5A:
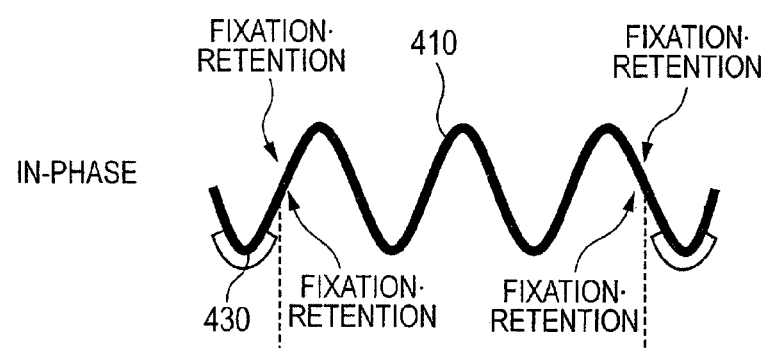
FIGS. 5A and 5B are schematic diagrams showing the vibration principle of the dust removing device of the present invention.
Figure 5B:
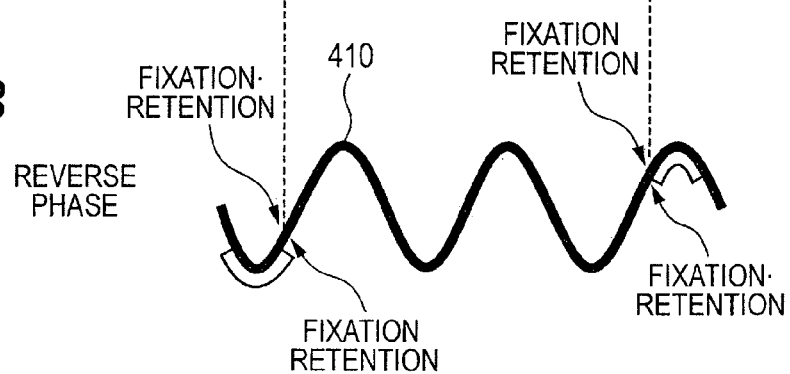

FIGS. 5A and 5B are schematic diagrams showing an example of the vibration principle of the dust removing device 470 of the present invention. For convenience, FIGS. 5A and 5B only show the piezoelectric element 430 and the vibration member 410. FIG. 5A shows a state in which in-phase alternating voltages are applied to a pair of right and left piezoelectric elements 430 to generate flexural vibration of a standing wave in the vibration member 410. In the pair of right and left piezoelectric elements 430, the polarization of the piezoelectric material 431 has the same direction as the thickness direction of the piezoelectric element 430, and the dust removing device 470 is driven in the seventh vibration mode. In this case, the vibration mode of the present invention refers to a multiple-order standing wave having multiple nodes and antinodes that can be created by the flexural vibration of the vibration member, and a traveling wave in which the nodes and the antinodes move in the longitudinal direction of the vibration member 410 with respect to time.

FIG. 5B shows a state in which reverse phase alternating voltages opposite by 180° are applied to the pair of right and left piezoelectric elements 430 through the flexible printed board 420 to generate flexural vibration of a standing wave in the vibration member 410. In the pair of right and left piezoelectric elements 430, the polarization of the piezoelectric material 431 has the same direction as the thickness direction of the piezoelectric element 430, and the dust removing device 470 is driven in the sixth vibration mode. Thus, the dust removing device 470 of this embodiment can remove dust adhering to the surface of the vibration member 410 more efficiently by using at least two different vibration modes effectively.

However, the dust removing device of the present invention is not driven only in such a vibration mode. The dust removing device of the present invention only needs to include a piezoelectric element formed of a piezoelectric material and a pair of opposing electrodes, a vibration member, and a fixation member containing at least a high molecular compound component. For example, one piezoelectric element 430 only needs to be provided on the vibration member 410, and further, in a pair of right and left piezoelectric elements 430, the polarization direction of the piezoelectric material 431 does not need to be the same as the thickness direction of the piezoelectric element 430. Further, instead of the above-mentioned sixth or seventh vibration mode, another vibration mode such as the eighteenth or nineteenth vibration mode may be used. Three or more kinds of vibration modes may also be used. Although FIGS. 5A and 5B show the vibration principle using a vibration mode of a standing wave, a vibration mode that controls any frequency and any phase and uses a traveling wave instead of a standing wave may be used. However, it is preferred to select an intrinsic mode that allows the resonance frequency of flexural vibration generated in the vibration member 410 to be out of an audible range, so as to prevent the dust removing device 470 from generating uncomfortable sound.

Further, it is preferred to select the piezoelectric element 430 and the vibration member 410 of the present invention that do not impair a mechanical quality factor Qm of the dust removing device 470. In this case, the mechanical quality factor Qm is a coefficient indicating an elasticity loss caused by the vibration when the piezoelectric element and the dust removing device are evaluated as a vibrator, and the magnitude of the mechanical quality factor is observed as the steepness of a resonant curve in impedance measurement. Specifically, the magnitude of the mechanical quality factor is a constant indicating the sharpness of resonance of the piezoelectric element 430. As the mechanical quality factor Qm becomes larger, flexural vibration of the vibration member 410 increases further in the vicinity of the resonance frequency, with the result that the dust removing device 470 capable of removing dust effectively is obtained.

Accordingly, as the vibration member 410 of the present invention, any vibration member can be used as long as it serves to remove dust adhering to the surface of the vibration member. However, it is preferred to select a member having a highest possible mechanical quality factor. Similarly, as the piezoelectric element 430 of the present invention, it is preferred to select a member having a highest possible mechanical quality factor. Further, the surface of the piezoelectric element 430 may be coated with a substance to which dust does not adhere easily, or the surface may be treated to be conductive to prevent dust from adhering to the surface due to static electricity. Note that, such treatment may not be performed.

In the dust removing device of the present invention, the vibration to be generated in the piezoelectric element 430 is length vibration, and hence, the entire vibration member 410 and piezoelectric element 430 are subjected to flexural vibration in a certain vibration mode, as shown in FIGS. 5A and 5B. Therefore, a fixation member for setting the dust removing device on the base 501 such as an imaging device or a camera main body is required. The fixation member requires, as its function, vibration damping so as not to transmit excess vibration to the base 501. On the other hand, the fixation member has an aspect of inhibiting the vibration of the vibration member 410 to degrade the effect of removing dust. Therefore, a material containing at least a high molecular compound component is used for the fixation member so as to prevent the fixation member from inhibiting the vibration of the vibration member 410.

Herein, the high molecular compound of the present invention is a solid polymer having a repeating structure of a monomer having a molecular weight of about 10,000 or more, and examples of the polymer include natural rubber, synthetic rubber, a synthetic resin, and synthetic fibers. These materials are excellent in vibration damping because the modulus of elasticity is smaller than those of metal and ceramics, and hence, do not remarkably inhibit the vibration of the vibration member 410.

Although it is not necessary to provide only the sealing member 450 as the fixation member, it is preferred that a sealing space for preventing a foreign matter such as dust from entering the dust removing device of the present invention be formed between the vibration member 410 and the base 501. This is because, when the vibration member 410 is made of, for example, a transparent optical material, dust does not adhere to the vibration member 410 as long as dust on the front surface side of the vibration member 410 of the dust removing device 470 of the present invention is removed. Thus, it is preferred that a member capable of forming a sealing space, such as the sealing member 450, be provided. However, it is not always necessary that the sealing member 450 be made of only one member.

The piezoelectric element 430 and the vibration member 410 can be fixedly bonded to each other through adhesion with a resin, for example, a material containing at least a high molecular compound component such as an epoxy resin based adhesive. It is preferred to select an adhesive that does not impair the adhesiveness in a use temperature range of the dust removing device 470. It is also preferred to select an adhesive that does not impair flexural vibration generated in the vibration member 410. Thus, it is preferred to select an adhesive that does not impair a mechanical quality factor Qm of the dust removing device 470. Further, the piezoelectric element 430 has already been polarized, and hence, it is preferred that the adhesion temperature be less than the Curie temperature or depolarization temperature of the piezoelectric material 431.

The piezoelectric element 430 and the flexible printed board 420 can be fixedly bonded to each other through adhesion with an anisotropic conductive film (ACF) or a resin, for example, a material containing at least a high molecular compound component such as a conductive adhesive. It is preferred to select an adhesive that does not impair the adhesiveness in a use temperature range of the dust removing device 470. It is also preferred to select an adhesive that does not impair flexural vibration generated in the vibration member 410. Thus, it is preferred to select an adhesive that does not impair a mechanical quality factor Qm of the dust removing device 470. Further, the piezoelectric element 430 has already been polarized, and hence, it is preferred that the adhesion temperature be less than the Curie temperature or depolarization temperature of the piezoelectric material 431.

The dust removing device of the present invention includes a piezoelectric element formed of the piezoelectric material 431 and a pair of opposing electrodes, a vibration member, and a fixation member containing at least a high molecular compound component. Thus, the piezoelectric element 430 does not always need to be electrically connected to the flexible printed board 420, and for example, may be electrically connected through another method such as silver paste connection using lead wires.

The piezoelectric material 431 of the present invention is a ferroelectric material, in which a phase transition temperature T from a first ferroelectric crystal phase to a second ferroelectric crystal phase is $-60°C. \leq T \leq -5°C$. The ferroelectric material refers to a dielectric material in which electric dipoles are arranged spontaneously even without an external electric field, and the directions of the dipoles can be changed with an electric field. The ferroelectric material also exhibits an inverse piezoelectric effect in which the material is deformed under the application of an electric field.

The representative ferroelectric material is, for example, a substance containing crystal ($SiO_2$), lithium niobate ($LiNbO_3$), potassium niobate ($KNbO_3$), potassium sodium niobate ($KNaNbO_3$), barium titanate ($BaTiO_3$), lead titanate ($PbTiO_3$), lead zirconate titanate ($PbZrTiO_3$), lead metaniobate ($PbNb_2O_6$), zinc oxide ($ZnO$) or the like as a main component. For example, ($LaPbZrTiO_3$), ($LiKNaNbO_3$), and ($BaCaTiZrO_3$) are also representative thereof.

The ferroelectric material of the present invention is not limited to these materials, and only needs to be a dielectric material in which electric dipoles are arranged spontaneously even without an external electric field, and the directions of the dipoles can be changed with an electric field. Such a material can be easily evaluated by P-E hysteresis evaluation of spontaneous polarization and a coercive field by a Sawyer-Tower circuit.

The ferroelectric crystal phase of the present invention refers to a ferroelectric material that belongs to any of six crystal systems: triclinic, monoclinic, orthorhombic, hexagonal, trigonal or rhombohedral, and tetragonal phases, of the seven kinds of crystal systems called a crystal lattice.

The piezoelectric material 431 of the present invention has the feature that the phase transition temperature T from the first ferroelectric crystal phase to the second ferroelectric crystal phase is $-60°C. \leq T \leq -5°C$. Specifically, the piezoelectric material 431 is a material in which the phase transition temperature T from one ferroelectric crystal phase to another ferroelectric crystal phase is present at least in the range of $-60°C. \leq T \leq -5°C$. in this case, the first ferroelectric crystal phase and the second ferroelectric crystal phase refer to two different crystal systems of the seven kinds of crystal systems, and the first ferroelectric crystal phase and the second ferroelectric crystal phase are defined as crystal phases in which the first ferroelectric crystal phase appears at a temperature higher than that of the second ferroelectric crystal phase.

The phase transition temperature T can be obtained, for example, by measuring a dielectric constant of the piezoelectric element 430 while changing a measurement temperature through use of a minute alternating electric field and determining a temperature at which the dielectric constant exhibits a maximum. The phase transition temperature T can also be obtained from a temperature at which the crystal phase of the piezoelectric element 430 or the piezoelectric material 431 changes while changing a measurement temperature through use of X-ray diffraction or Raman spectrometry. As long as the temperature of the piezoelectric element 430 or the piezoelectric material 431 is kept to a measurement environment temperature for a sufficient period of time during which the temperature reaches the measurement environment temperature, the phase transition temperature T to be observed becomes the same in both the above-mentioned methods. Note that, a procedure of measuring a dielectric constant of the piezoelectric element 430 while changing a measurement temperature through use of a minute alternating electric field is preferred from the viewpoint of ease and reproducibility of measurement. Generally, in a ferroelectric material, there is a slight temperature difference between a phase transition temperature from a first ferroelectric crystal phase to a second ferroelectric crystal phase (phase transition temperature during the decrease in temperature) and a phase transition temperature from the second ferroelectric crystal phase to the first ferroelectric crystal phase (phase transition temperature during the increase in temperature). However, the phase transition temperature T of the present invention is a phase transition temperature from the first ferroelectric crystal phase to the second ferroelectric crystal phase, that is, a phase transition temperature during the decrease in temperature.

Although the phase transition temperature T may be evaluated before or after the polarization of the piezoelectric element 430, the dust removing device 470 of the present invention includes the polarized piezoelectric element 430, and hence, it is preferred to evaluate the phase transition temperature T after the polarization of the piezoelectric element 430. The polarization of the piezoelectric element 430 can be confirmed, for example, by evaluating whether or not length vibration of the piezoelectric element 430 occurs by a resonance-antiresonance method.

Figure 6A:
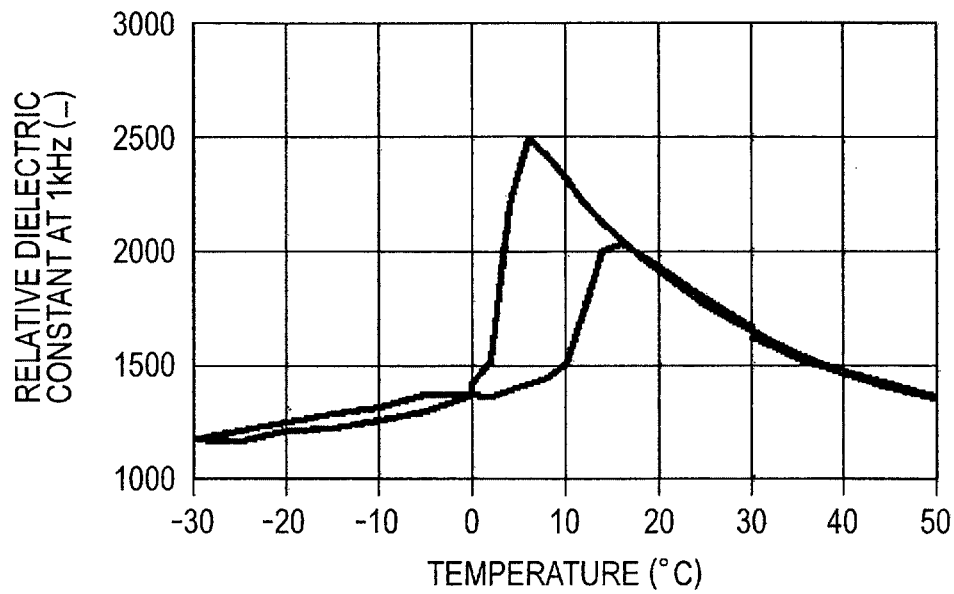
FIGS. 6A and 6B are graphs showing examples of a relative dielectric constant and a resonance frequency of a conventional piezoelectric material, respectively.
Figure 6B:
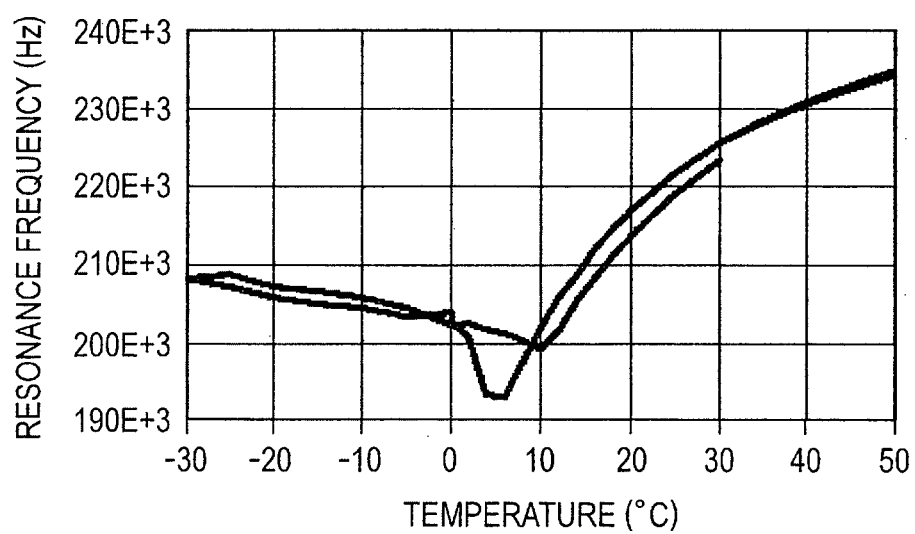

FIGS. 6A and 6B respectively show, as an example of a conventional piezoelectric material, a relative dielectric constant at 1 kHz of a barium titanate piezoelectric element that is a typical ferroelectric material and a resonance frequency at which length vibration is generated in the longitudinal direction. Similarly, FIGS. 7A and 7B respectively show a relative dielectric constant at 1 kHz of the piezoelectric material 431 of the present invention and a resonance frequency at which length vibration is generated in the longitudinal direction. The dimensions of the piezoelectric element are 10×2.5×0.5 mm. FIGS. 6A and 6B and FIGS. 7A and 7B all show measurement results obtained by starting the measurement at 30° C. and changing the temperature in the order of an increase, a decrease, and an increase to 30° C. The measurement is performed in a constant temperature reservoir, and the reservoir is kept at each temperature for a predetermined period of time. Then, a dielectric constant and a resonance frequency at each temperature after the temperature becomes stable are evaluated. In FIGS. 6A and 6B and FIGS. 7A and 7B, the dielectric constant and the resonance frequency change with respect to the temperature in different manners between the increase in temperature and the decrease in temperature. This is because a ferroelectric material has a slight temperature difference between the phase transition temperature from the first ferroelectric crystal phase to the second ferroelectric crystal phase (phase transition temperature during the decrease in temperature) and the phase transition temperature from the second ferroelectric crystal phase to the first ferroelectric crystal phase (phase transition temperature during the increase in temperature). In this case, when the phase transition temperature from the first ferroelectric crystal phase to the second ferroelectric crystal phase (phase transition temperature during the decrease in temperature) is compared with the phase transition temperature from the second ferroelectric crystal phase to the first ferroelectric crystal phase (phase transition temperature during the increase in temperature), the phase transition temperature from the first ferroelectric crystal phase to the second ferroelectric crystal phase (phase transition temperature during the decrease in temperature) is lower.

It is understood from FIGS. 6A and 6B and FIGS. 7A and 7B that barium titanate has a phase transition temperature T in the vicinity of 5° C., and the piezoelectric material 431 of the present invention has a phase transition temperature T in the vicinity of −25° C. It is also understood that the resonance frequency of the piezoelectric element becomes minimum in the vicinity of the phase transition temperature T. Similarly, as an example of a conventional piezoelectric element, zirconate titanate was evaluated, but there was no phase transition temperature T at least in a range of −60° C. to 50° C., and similarly, there was no temperature at which a resonance frequency became minimum.

As a result of extensive studies, it was found that, in the dust removing devices including the conventional piezoelectric materials, the driving frequency of the dust removing device increases as described later along with a decrease in temperature, and the increase in driving frequency is remarkable particularly at a temperature from −5° C. to −30° C. In general, the dust removing device is configured to sweep a frequency band in the vicinity of a resonance frequency so as to remove dust without any problem even with respect to an individual variation in dust removing device and a fluctuation in frequency with respect to temperature. However, in the conventional dust removing device, a driving frequency of the dust removing device increases along with a decrease in temperature, and hence, it is necessary to enlarge a sweeping frequency band of the dust removing device in advance. Further, in order to avoid the problem of enlarging a sweeping frequency band in advance, dust should be removed through use of another elastic vibration in a low temperature range.

Figure 7A:
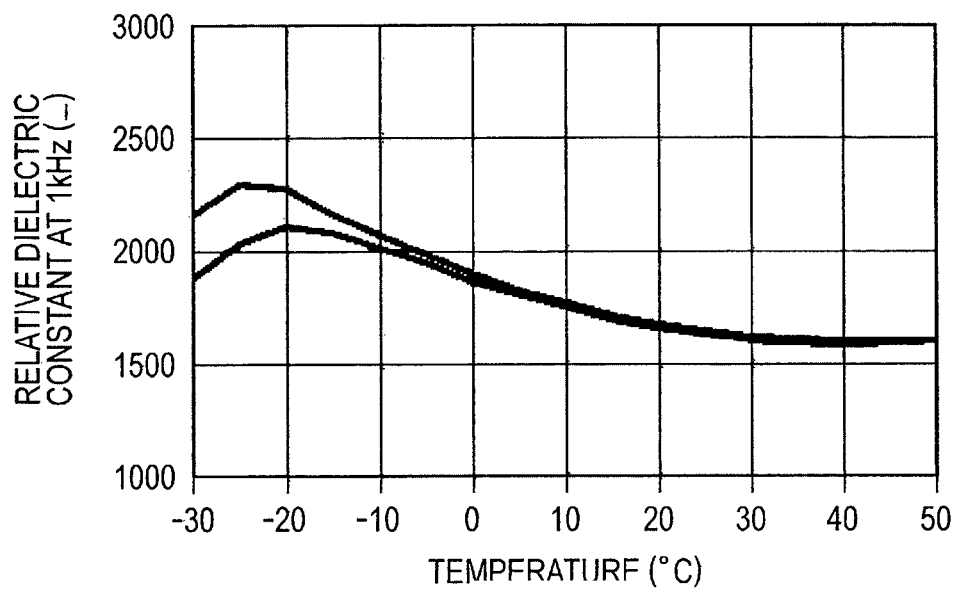
FIGS. 7A and 7B are graphs showing examples of a relative dielectric constant and a resonance frequency of a piezoelectric material of the present invention, respectively.
Figure 7B:
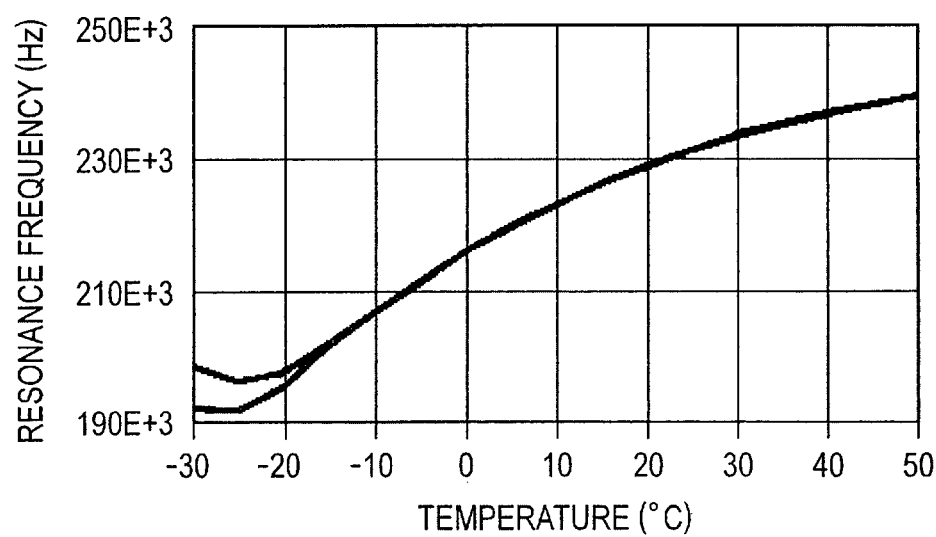

On the other hand, the dust removing device 470 of the present invention includes the piezoelectric material 431 as shown in FIGS. 7A and 7B, and hence, a driving frequency of the dust removing device 470 does not increase at low temperature. Therefore, the sweeping frequency band of the dust removing device 470 can be narrowed further than that of the conventional dust removing device. The reason that the piezoelectric material 431 of the present invention exhibits a resonance frequency of length vibration as shown in FIGS. 7A and 7B is considered as follows. The phase transition temperature T of the piezoelectric material 431 of the present invention is $-60° C. \leq T \leq -5° C.$, and the modulus of elasticity of the material in the vicinity of the phase transition temperature T becomes small.

When the phase transition temperature T from the first ferroelectric crystal phase to the second ferroelectric crystal phase of the piezoelectric material is T>−5° C., the modulus of elasticity becomes remarkably large on a side lower than −5° C. Thus, the driving frequency of the dust removing device increases along with a decrease in temperature on the side lower than −5° C., and as a result, it is necessary to enlarge a sweeping frequency band of the dust removing device in advance.

When the phase transition temperature T from the first ferroelectric crystal phase to the second ferroelectric crystal phase of the piezoelectric material is T<−60° C., generally in a dust removing device including a piezoelectric element formed of a piezoelectric material and a pair of opposing electrodes, a vibration member, and a fixation member containing at least a high molecular compound component, the problem of an increase in driving frequency of the dust removing device along with a decrease in temperature cannot be solved substantially, which makes it necessary to enlarge a sweeping frequency band of the dust removing device in advance.

Further, as a result of the extensive studies, it was found that a piezoelectric element in which the phase transition temperature T from the first ferroelectric crystal phase to the second ferroelectric crystal phase of a piezoelectric material is T<−60° C. cannot generate flexural vibration equal to that of the conventional example in the vibration member 410, compared with a piezoelectric element made of a piezoelectric material having large piezoelectric various characteristics such as a piezoelectric constant in which a phase transition temperature T is not present at least in a range of −60° C. to −5° C., such as zirconate titanate.

In the dust removing device including a conventional piezoelectric material, a driving frequency of the dust removing device increases along with a decrease in temperature, and the reason for this is not necessarily clear. However, the vibration member, the adhesion of the piezoelectric element and the vibration member, the adhesion of the piezoelectric element and the flexible printed board, the fixation member, and the like may influence the increase in driving frequency.

It is preferred that a modulus of elasticity at 25° C. of the fixation member of the present invention be smaller than that at −5° C. In general, there is a tendency that dust adhering to the vibration member 410 is not removed easily in an environment at high humidity. This is because dust containing moisture is not removed easily, compared with dry dust. The environment at high humidity tends to occur at higher temperature compared with lower temperature. The modulus of elasticity of the fixation member influences vibration performance of the dust removing device, and the fixation member with a larger modulus of elasticity further inhibits the vibration performance of the dust removing device. The modulus of elasticity at 25° C. of the fixation member of the present invention is smaller than that at −5° C., and hence, the fixation member of the present invention allows the vibration performance of the dust removing device to be excellent at high temperature at which an environment at higher humidity tends to occur. Accordingly, a voltage to be applied to the piezoelectric element 430 at high temperature can be lowered, compared with that of the conventional dust removing device. On the other hand, an example of a fixation member whose modulus of elasticity at 25° C. is larger than that at −5° C. is a resin molded with a carbon nanotube dispersed in a high molecular compound. Even in this case, there is no large difference in vibration performance of the dust removing device between low temperature and high temperature, but the dust removal performance at high temperature is degraded, and hence, it is necessary to increase a voltage to be applied to the piezoelectric element 430.

It is preferred that the difference between the modulus of elasticity at 25° C. of the fixation member of the present invention and the modulus of elasticity at −5° C. thereof be 0.1 MPa or more or 10 times or more. A difference of 0.1 MPa or more or 10 times or more enhances the effect that the vibration performance of the dust removing device is excellent at high temperature at which an environment at higher humidity tends to occur.

The difference in modulus of elasticity with respect to the temperature of the fixation member can be evaluated, for example, by comparing a storage elastic modulus G' through dynamic viscoelastic analysis (DMA) or the like.

It is preferred that the fixation member of the present invention be an elastomer. The elastomer of the present invention is a rubber-like elastic body, which exhibits a low modulus of elasticity of 1 to 10 MPa. In general, the elastomer refers to rubber having cross-linking points in molecules and having a three-dimensional network structure in terms of a molecular structure, that is, a thermoplastic elastomer having no crosslinking (bonded portions) in molecules in which molecules are prevented from flowing by being bound by a molecule group in a hard layer in the molecules. When the elastomer is used for the fixation member, the vibration performance of the dust removing device becomes further excellent as a whole. Examples of the representative elastomer include an acrylic rubber, a nitrile rubber, an isoprene rubber, a urethane rubber, an ethylene-propylene rubber, a chlorosulfonated polyethylene rubber, an epichlorohydrin rubber, a chloroprene rubber, a silicone rubber, a styrene-butadiene rubber, a butadiene rubber, a fluororubber, and a butyl rubber.

It is preferred that the fixation member of the present invention be a foamed resin. The foamed resin of the present invention is a foamable or porous high molecular compound. When the fixation member is made of a foamed resin, the vibration damping of the dust removing device becomes further excellent. Examples of the representative foamed resin include what is called a sponge and a foam. Each of those is made of a synthetic resin or a synthetic rubber such as polyurethane, polystyrene, polyolefin (mainly polyethylene or polypropylene), silicone, or polyimide.

It is preferred that the fixation member of the present invention be a polymer having thermoplasticity, of the above-mentioned high molecular compound components. The thermoplastic resin of the present invention refers to a resin that becomes softer when being heated and becomes harder when being cooled, and a modulus of elasticity of the thermoplastic resin decreases along with an increase in temperature. In general, the thermoplastic resin refers to a resin having no crosslinking (bonded portions) in molecules in which molecules are prevented from flowing by being bound by a molecule group in a hard layer in the molecules. As described above, the modulus of elasticity of the fixation member influences the vibration performance of the dust removing device, and the fixation member with a larger modulus of elasticity further inhibits the vibration performance of the dust removing device. However, when the high molecular compound component of the fixation member is thermoplastic, the modulus of elasticity of the fixation member decreases along with an increase in temperature, and hence, the fixation member allows the vibration performance of the dust removing device to be further excellent at high temperature at which an environment at higher humidity tends to occur.

For the above-mentioned reasons, the most preferred fixation member of the present invention is made of a thermoplastic foamable elastomer, and for example, polyurethane foam having rubber elasticity is one of the most preferred materials for the fixation member. Such a high molecular compound component generally has a glass transition temperature (Tg) in a range equal to or lower than room temperature in most cases. In the vicinity of a glass transition temperature, the dust removing device is most excellent in vibration damping as well as vibration performance. Therefore, if a thermoplastic foamable elastomer having a glass transition temperature preferably in a range equal to or lower than room temperature can be selected for the fixation member, it is possible to realize a dust removing device which exhibits particularly excellent dust removal performance from a room temperature range in which the most excellent dust removal performance is preferably obtained to a high-temperature range in which an environment with higher humidity tends to occur.

On the other hand, a dust removing device including a fixation member containing such a high molecular compound component has a feature in which a driving frequency of the dust removing device becomes remarkably high along with a decrease in temperature. However, the dust removing device 470 of the present invention includes the piezoelectric material 431 as shown in FIGS. 7A and 7B, and hence, a driving frequency of the dust removing device 470 does not increase at low temperature. Therefore, a sweeping frequency band of the dust removing device 470 can be narrowed compared with that of the conventional dust removing device.

Herein, the glass transition temperature of the present invention refers to temperature at which glass transition occurs in an amorphous solid material, and is generally denoted with Tg. In an amorphous state at temperature lower than the glass transition temperature, a substance assumes a glass state, and the substance assumes a rubber state at temperature higher than the glass transition temperature. The glass transition temperature can be evaluated by differential scanning calorimetry (DSC), differential thermal analysis (DTA), thermo-mechanical analysis (TMA), dynamic mechanical analysis (DMA), or the like.

It is preferred that a first ferroelectric crystal phase of the piezoelectric material 431 of the present invention be a tetragonal phase. The ferroelectric crystal phase of the present invention belongs to any one of six crystal systems: triclinic, monoclinic, orthorhombic, hexagonal, trigonal or rhombohedral, and tetragonal phases. Of those, a crystal system having the highest symmetry is a tetragonal phase. A ferroelectric material refers to a dielectric material in which electric dipoles are arranged spontaneously even without an external electric field, and the directions of the dipoles can be changed with an electric field. In actual crystal, there are multiple regions in which the directions of the electric dipoles are different. Such a region is called a ferroelectric domain, and this domain is more complicated in a material having lower symmetry.

By the way, it is preferred that the piezoelectric element 430 of the present invention have a large mechanical quality factor Qm, but the mechanical quality factor decreases as the domain becomes complicated. This is because energy obtained in mechanical replacement is thermally consumed more in a boundary portion between the domains. Therefore, when the first ferroelectric crystal phase is a tetragonal phase, a dust removing device more excellent in dust removal performance at temperature equal to or higher than the phase transition temperature T can be realized easily.

Further, as another aspect, it is preferred that the second ferroelectric crystal phase of the piezoelectric material 431 of the present invention be an orthorhombic phase. Although the orthorhombic phase has lower symmetry compared with those of a trigonal or rhombohedral phase, and a hexagonal phase, the orthorhombic phase can be subjected to phase transformation by a small change in crystal lattice from a tetragonal phase. Thus, a crystal phase can be transformed with a smaller stress when temperature changes across the phase transition temperature T. Therefore, the possibility of peeling of electrodes decreases, and the piezoelectric element 430 having less degradation in material characteristics can be realized at the time of temperature reliability evaluation in which the temperature is changed across the phase transition temperature T repeatedly.

Note that, the first ferroelectric crystal phase and the second ferroelectric crystal phase of the present invention can be determined, for example, based on structural analysis by X-ray diffraction or electron diffraction.

It is preferred that the content of lead in the piezoelectric material 431 of the present invention be less than 1,000 ppm. In the conventional dust removing device, most of the piezoelectric materials are piezoelectric ceramics containing lead zirconate titanate as its main component. Therefore, it has been pointed out that, for example, when the dust removing device is discarded and exposed to acid rain or left in a severe environment, a lead component in a piezoelectric material may be dissolved in the soil to harm an ecological system. However, if the content of lead is less than 1,000 ppm, for example, even when the dust removing device 470 is discarded and exposed to acid rain or left in a severe environment, there is a low possibility that the lead component in the piezoelectric material 431 has an adverse effect on the environment.

The content of lead in the piezoelectric material 431 can be evaluated based on the content of lead with respect to the total weight of the piezoelectric material 431 quantified, for example, by X-ray fluorescence analysis (XRF) or ICP emission spectrochemical analysis.

It is preferred that the piezoelectric material 431 of the present invention be a piezoelectric ceramics containing barium titanate as its main component. Currently, in such a lead-free piezoelectric ceramics, an excellent material having various characteristics equivalent to those of a piezoelectric ceramics containing lead zirconate titanate as its main component has not been realized. However, for example, in the case where the piezoelectric material 431 is a piezoelectric ceramics containing barium titanate as its main component, a modulus of elasticity of the piezoelectric material 431 becomes larger than that of lead zirconate titanate. The dust removing device 470 of the present invention generates flexural vibration in the vibration member 410 by length vibration of the piezoelectric element 430, and it was found that if the modulus of elasticity of the piezoelectric element 430 is large, the piezoelectric element 430 can generate flexural vibration equal to that of the conventional example in the vibration member 410, even when various piezoelectric characteristics such as a piezoelectric constant are slightly inferior to those of lead zirconate titanate. Therefore, it is preferred that the piezoelectric material 431 of the present invention be a piezoelectric ceramics containing barium titanate as its main component, from the viewpoint of an environment.

The ceramics as used herein refers to an aggregate (also referred to as "bulk body") of crystal grains baked by heat treatment, which is a so-called polycrystal, containing a metal oxide as its basic component. The ceramics also include those which are treated after sintering.

It is preferred that the piezoelectric material 431 of the present invention contain, as its main component, a perovskite-type metal oxide represented by the following general formula (1):

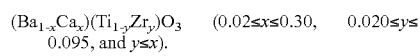

$(Ba_{1-x}Ca_x)(Ti_{1-y}Zr_y)O_3$ $(0.02 \le x \le 0.30, 0.020 \le y \le 0.095, \text{ and } y \le x)$.

As a result of extensive studies, it was found that, for example, in a dust removing device including a conventional piezoelectric material whose piezoelectric characteristics change less with respect to temperature, such as lead zirconate titanate, an amplitude of the vibration member decreases along with a decrease in temperature and dust removal performance may be degraded. On the other hand, when the piezoelectric material 431 is used for the dust removing device 470 of the present invention, it becomes very easy to set the phase transition temperature T to $-60°C \le T \le -5°C$ at a time of designing materials, and piezoelectric characteristics are enhanced remarkably with the phase transition temperature T maximum. Accordingly, a dust removing device having high dust removal performance even at low temperature and an imaging device using the dust removing device can be provided.

In the present invention, the perovskite-type metal oxide refers to a metal oxide having a perovskite-type structure that is ideally a cubic structure as described in NPL 1. A metal oxide having a perovskite-type structure is generally represented by a chemical formula of $ABO_3$. In the perovskite-type metal oxide, elements A and B occupy particular positions of unit cells called an A site and a B site respectively in the shape of ions. For example, in the case of a unit cell of a cubic structure, an A element occupies a vertex of the cube and a B element occupies the body-centered position of the cube. An O element occupies the face-centered position of the cube as an anion of oxygen.

A metal oxide represented by the above-mentioned general formula (1) means that metal elements positioned at an A site are Ba and Ca and metal elements positioned at a B site are Ti and Zr. Note that, a part of Ba and Ca may be positioned at the B site. Similarly, a part of Ti and Zr may be positioned at the A site.

A molar ratio between the elements at the B site and the O element in the general formula (1) is 1:3. Even the case where the molar ratio is slightly shifted (for example, 1.00:2.94 to 1.00:3.06) can be included in the scope of the present invention, if the metal oxide has a perovskite-type structure as a main phase.

It can be determined from structural analysis, for example, by X-ray diffraction or electron diffraction that a metal oxide has a perovskite-type structure.

In the general formula (1), "x" representing a molar ratio of Ca at the A site is in a range of $0.02 \leq x \leq 0.30$. When the "x" is smaller than 0.02, a dielectric loss (tan δ) increases. When the dielectric loss increases, heat generated when the piezoelectric element 430 is supplied with a voltage to be driven increases, and there is a possibility that driving efficiency may be degraded. On the other hand, when the "x" is larger than 0.30, there is a possibility that piezoelectric characteristics may not be sufficient.

In the general formula (1), "y" representing a molar ratio of Zr at the B site is in a range of $0.020 \leq y \leq 0.095$. When the "y" is smaller than 0.020, piezoelectric characteristics may not be sufficient. On the other hand, when the "y" is larger than 0.095, a Curie temperature (Tc) becomes less than 85° C., and there is a possibility that piezoelectric characteristics may disappear at high temperature.

The Curie temperature as used herein refers to temperature at which ferroelectricity disappears. As a method of identifying the disappearance of ferroelectricity, there is a method of measuring a dielectric constant while changing a measurement temperature through use of a minute alternating electric field and determining a temperature at which ferroelectricity disappears from a temperature at which the dielectric constant exhibits maximum, in addition to a method of directly measuring a temperature at which ferroelectricity disappears while changing a measurement temperature.

In the general formula (1), the molar ratio x of Ca and the molar ratio y of Zr are in a range of $y \leq x$. When $y > x$, a dielectric loss increases and an insulation property may not become sufficient. Further, when the ranges of x and y are satisfied simultaneously, the phase transition temperature T can be moved from the vicinity of room temperature to temperature equal to or lower than driving temperature, and the piezoelectric element 430 can be driven stably in a wide temperature range.

Further, in the general formula (1), it is preferred that a ratio A/B of the molar quantity of Ba and Ca at the A site and the molar quantity of Ti and Zr at the B site be in a range of $1.00 \leq A/B \leq 1.01$. When the A/B is smaller than 1.00, abnormal grains grow easily, and the mechanical strength of the piezoelectric material 431 may decrease. On the other hand, when the A/B becomes larger than 1.01, temperature required for the growth of grains becomes too high, and density does not increase sufficiently in a general baking furnace, and a large number of pores and defects may be present in the piezoelectric material 431.

There is no particular limit to a method of measuring a composition of the piezoelectric material 431 of the present invention. Examples of the method include X-ray fluorescence analysis, ICP emission spectrochemical analysis, and atomic absorption analysis. In any method, a weight ratio and a composition ratio of elements contained in the piezoelectric material 431 can be calculated.

It is preferred that the piezoelectric material 431 of the present invention contain the perovskite-type metal oxide represented by the general formula (1) as its main component, that the metal oxide contain Mn, and that the content of the Mn be 0.02 parts by weight to 0.40 parts by weight on a metal basis with respect to 100 parts by weight of the metal oxide.

When the metal oxide contains Mn in the above-mentioned range, an insulation property and a mechanical quality factor Qm are enhanced. It is considered that the enhancement of an insulation property and a mechanical quality factor are derived from the generation of an internal electric field caused by the introduction of defective dipoles by Mn having a different valence from those of Ti and Zr. In the case where an internal electric field is present, the reliability of the piezoelectric element 430 can be ensured when the piezoelectric element 430 is supplied with a voltage to be driven.

In this case, the value on a metal basis representing the content of Mn refers to a value obtained by converting the elements constituting the metal oxide represented by the general formula (1) on an oxide basis from the contents of the respective metals: Ba, Ca, Ti, Zr, and Mn measured by X-ray fluorescence analysis (XRF), ICP emission spectrochemical analysis, atomic absorption analysis, or the like from the piezoelectric material 431, and calculating a ratio of the Mn weight with respect to the total weight of the elements (assumed to be 100).

When the content of Mn is less than 0.02 parts by weight, the effect of polarization required for driving the piezoelectric element 430 is not sufficient. On the other hand, it is not preferred that the content of Mn be more than 0.40 parts by weight, because the piezoelectric characteristics are not sufficient, and a crystal having a hexagonal structure that does not contribute to the piezoelectric characteristics appears.

Mn is not limited to a metal Mn and only needs to be contained in a piezoelectric material as a Mn component, and the contained form of Mn is not particularly limited. For example, Mn may be dissolved in the B site or may be contained in a grain boundary. Alternatively, the Mn component may be contained in the piezoelectric material 431 in the form of a metal, an ion, an oxide, a metal salt, a complex, or the like. The more preferred contained form is a solid solution of the Mn component at the B site, from the viewpoint of an insulation property and sinterability. In the case where the Mn component is dissolved at the B site, a preferred range of A/B is $0.993 \leq A/B \leq 0.998$, where A/B is a ratio between the molar quantity of Ba and Ca at the A site and the molar quantity of Ti, Zr, and Mn at the B site. In the piezoelectric element 430 in which A/B is in this range, length vibration is large in the longitudinal direction of the piezoelectric element 430, and a mechanical quality factor is high. Therefore, the dust removing device 470 excellent in dust removal performance and durability can be obtained.

The piezoelectric material 431 of the present invention may contain components (hereinafter referred to as "auxiliary components") other than the metal oxide represented by the general formula (1) and Mn in a range not varying characteristics. It is preferred that the total amount of the auxiliary components be less than 1.2 parts by weight with respect to 100 parts by weight of the metal oxide represented by the general formula (1). When the amount of the auxiliary components exceeds 1.2 parts by weight, there is a possibility that the piezoelectric characteristics and insulation property of the piezoelectric material 431 may be degraded. Further, it is preferred that, of the auxiliary components, the content of metal elements other than Ba, Ca, Ti, Zr, and Mn be 1.0 part by weight or less on an oxide basis or 0.9 parts by weight or less on a metal basis with respect to the piezoelectric material 431. The metal elements of the present invention include metalloid elements such as Si, Ge, and Sb. When, of the auxiliary components, the content of metal elements other than Ba, Ca, Ti, Zr, and Mn exceeds 1.0 part by weight on an oxide basis or 0.9 parts by weight on a metal basis with respect to the piezoelectric material 431, there is a possibility that the piezoelectric characteristics and insulation property of the piezoelectric material 431 may be degraded remarkably. It is preferred that, of the auxiliary components, the total amount of Li, Na, Mg, and Al elements be 0.5 parts by weight or less on a metal basis with respect to the piezoelectric material 431. When, of the auxiliary components, the total amount of Li, Na, Mg, and Al elements exceeds 0.5 parts by weight on a metal basis with respect to the piezoelectric material 431, there is a possibility that sintering may be insufficient. It is preferred that, of the auxiliary components, the total amount of Y and V elements be 0.2 parts by weight or less on a metal basis with respect to the piezoelectric material 431. When, of the auxiliary components, the total amount of Y and V elements exceeds 0.2 parts by weight on a metal basis with respect to the piezoelectric material 431, there is a possibility that polarization may be difficult.

Examples of the auxiliary components include sintering aids such as Si and Cu. Further, Sr and Mg that are contained in commercially available materials of Ba and Ca as inevitable components may be contained in the piezoelectric material of the present invention. Similarly, Nb contained in a commercially available material of Ti as an inevitable component and Hf contained in a commercially available material of Zr as an inevitable component may be contained in the piezoelectric material 431 of the present invention.

There is no particular limit to a method of measuring the parts by weight of the auxiliary components. Examples of the method include X-ray fluorescence analysis (XRF), ICP emission spectrochemical analysis, and atomic absorption analysis.

It is preferred that the piezoelectric element 430 and the vibration member 410 of the present invention have a plate shape, that one electrode surface of the piezoelectric element 430 be fixedly bonded to a plate surface of the vibration member 410, and that the vibration member 410 be fixed to a base through the intermediation of the fixation member. It is further preferred that multiple piezoelectric elements 430 of the present invention be provided.

The thickness of the piezoelectric element 430 of the present invention is generally 0.1 mm to 10 mm. In the piezoelectric element 430, the piezoelectric material 431 is polarized in the direction 434 perpendicular to the first electrode surface 436 in advance so that a high frequency voltage can be applied from a power source to the first electrode 432 and the second electrode 433. Then, in the piezoelectric element 430, length vibration is generated in the longitudinal direction of the piezoelectric element 430 due to length distortion of the piezoelectric material 431 caused by an alternating electric field generated in the direction indicated by the arrow of the electric field direction 435. Therefore, as long as the piezoelectric element 430 has a plate shape, the piezoelectric element 430 can be applied with a higher electric field with a lower voltage.

Further, flexural vibration is generated in the vibration member 410 by length vibration of the piezoelectric element 430, and larger flexural vibration can be generated in the vibration member 410 if the vibration member 410 has a plate shape. Further, when one electrode surface of the piezoelectric element 430 is fixedly bonded to the plate surface of the vibration member 410, flexural vibration can be derived from the length vibration of the piezoelectric element 430 to the vibration member 410 more efficiently.

Further, when the vibration member 410 is fixed to a base through the intermediation of the fixation member, the vibration performance of the dust removing device 470 is not inhibited, compared with the case where the piezoelectric element 430 is fixed to the base through the intermediation of the fixation member.

Particularly, in a rectangular dust removing device, even when dust is to be removed in one vibration mode, the fixation member inevitably comes into contact with a site other than a node of the vibration member. Therefore, the dust removing device 470 of the present invention is particularly preferred as a rectangular dust removing device.

It is preferred that the vibration member 410 of the present invention be made of an optical material. The optical material of the present invention is a material having an optical function with respect to incident light. Examples of the optical function include transmission, refraction, interference, reflection, and scattering. The vibration member 410 may have an optical function such as an infrared cut filter, an ultraviolet cut filter, and an optical low-pass filter, as well as the function as a vibration member. Herein, the infrared cut filter is an optical member for transmitting visible light and blocking infrared (IR) light, and is made of, for example, glass. Similarly, the ultraviolet cut filter is an optical member for blocking ultraviolet (UV) light. Further, the optical low-pass filter is an optical member for separating light into ordinary light and extraordinary light so as to remove a spatial frequency component having a high transmittance, and for example, is a multilayered structure including multiple birefringent plates and phase plates made of quartz. Note that, the optical low-pass filter may be a member of glass or the like, which is not provided with an optical special function.

Further, in order to prevent dust from electrically adhering to the vibration member 410, the surface of the vibration member 410 may be coated with a conductive material or the like. Further, the vibration member 410 may be formed of multiple members respectively having different functions as described above. In this case, it is preferred that a member having a highest possible mechanical quality factor be selected for the vibration member 410, as long as the member has a required function.

The imaging device of the present invention is an imaging device including at least a dust removing device and an image pickup element unit, in which the vibration member 410 of the dust removing device and a light receiving surface of the image pickup element unit are provided coaxially in this order. An imaging device according to an exemplary embodiment of the present invention is described below.

Figure 8:
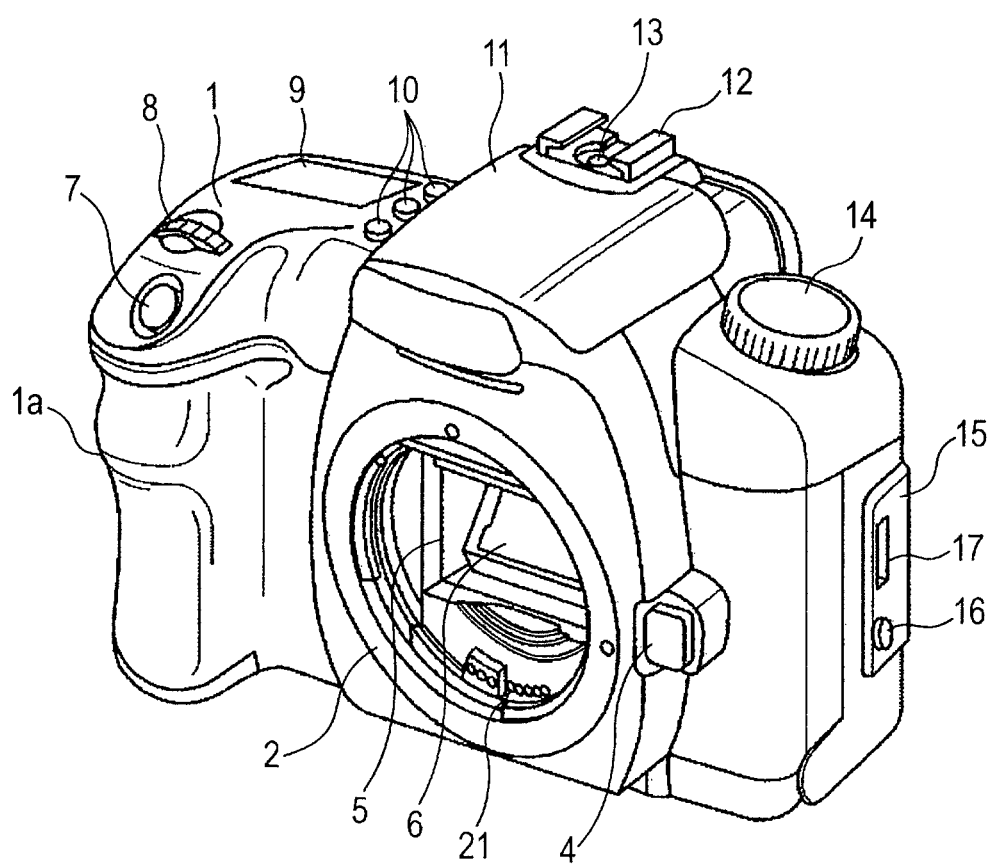
FIG. 8 is a view illustrating an example of an imaging device of the present invention.
Figure 9:
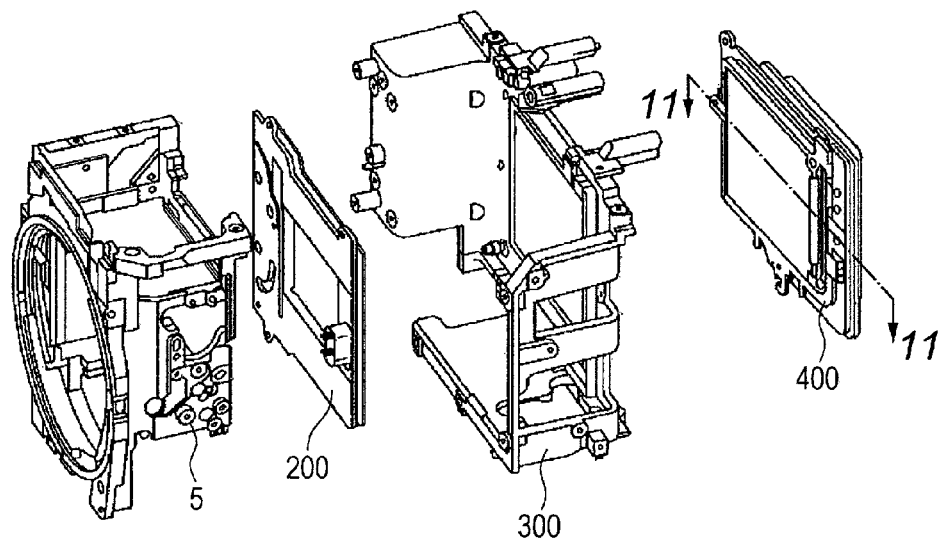
FIG. 9 is a view illustrating an example of the imaging device of the present invention.

FIGS. 8 and 9 are views illustrating a digital single-lens reflex camera, which is the imaging device according to the exemplary embodiment of the present invention.

FIG. 8 is a front perspective view of a camera main body 1 when viewed from a subject side, illustrating a state with a photographing lens unit removed. FIG. 9 is an exploded perspective view illustrating a schematic configuration of an inside of a camera for illustrating a peripheral structure of a dust removing device and an image pickup unit 400 of the present invention.

In the camera main body 1, a mirror box 5 into which a photographing luminous flux having passed through a photographing lens is guided is provided, and in the mirror box 5, a main mirror (quick return mirror) 6 is provided. The main mirror 6 can have a state in which the main mirror 6 is held at an angle of 45° with respect to a photographing optical axis for guiding a photographing luminous flux to a penta-Dach mirror 22 (not shown) and a state in which the main mirror 6 is held at a position retreated from the photographing luminous flux for guiding the photographing luminous flux to an image pickup element 570 (see FIG. 10).

On the subject side of a main body chassis 300 to be a framework of the camera main body, the mirror box 5 and a shutter unit 200 are arranged in this order from the subject side. Further, on a photographer side of the main body chassis 300, the image pickup unit 400 is arranged. The image pickup unit 400 is adjusted and set so that an imaging surface of the image pickup element 570 is placed at a predetermined distance in parallel with a mounting surface of a mount portion 2 to be a reference for mounting a photographing lens unit.

Herein, although the digital single-lens reflex camera has been described as the imaging device of the present invention, for example, a photographing lens unit replaceable camera such as a mirror-less digital single-lens reflex camera including no mirror box 5 may be used. Further, the present invention may also be applied to equipment requiring removal of dust adhering to the surface of an optical component, in particular, of various imaging devices such as a photographing lens unit replaceable video camera, a copier, a facsimile, and a scanner, or electrical and electronic equipment including an imaging device.

Figure 10:
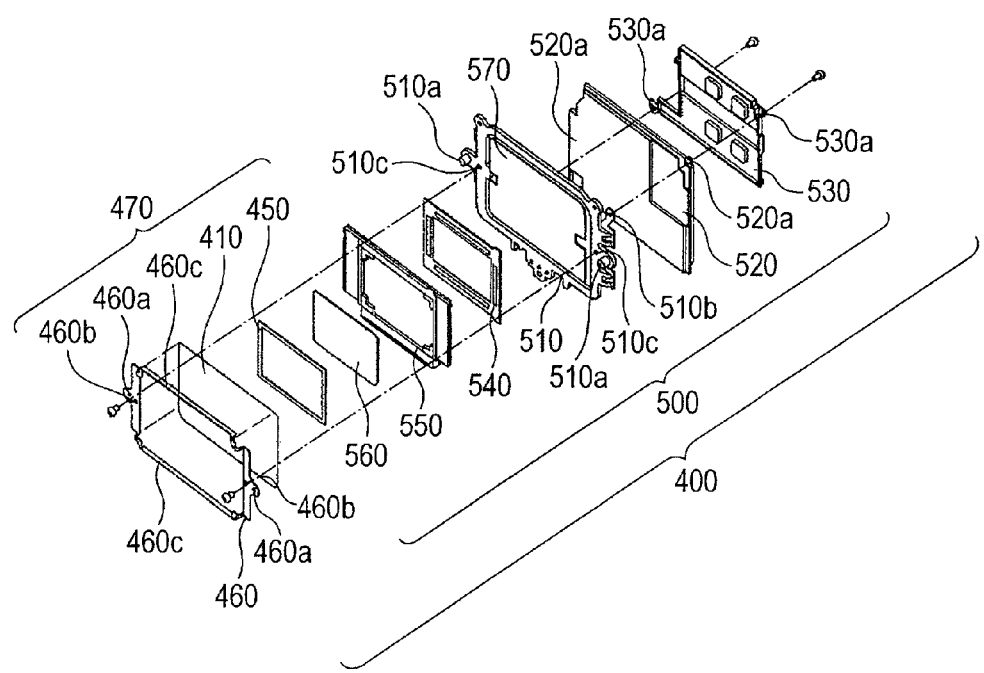
FIG. 10 is an exploded perspective view illustrating an example of a configuration of an image pickup unit of the imaging device of the present invention.
Figure 11:
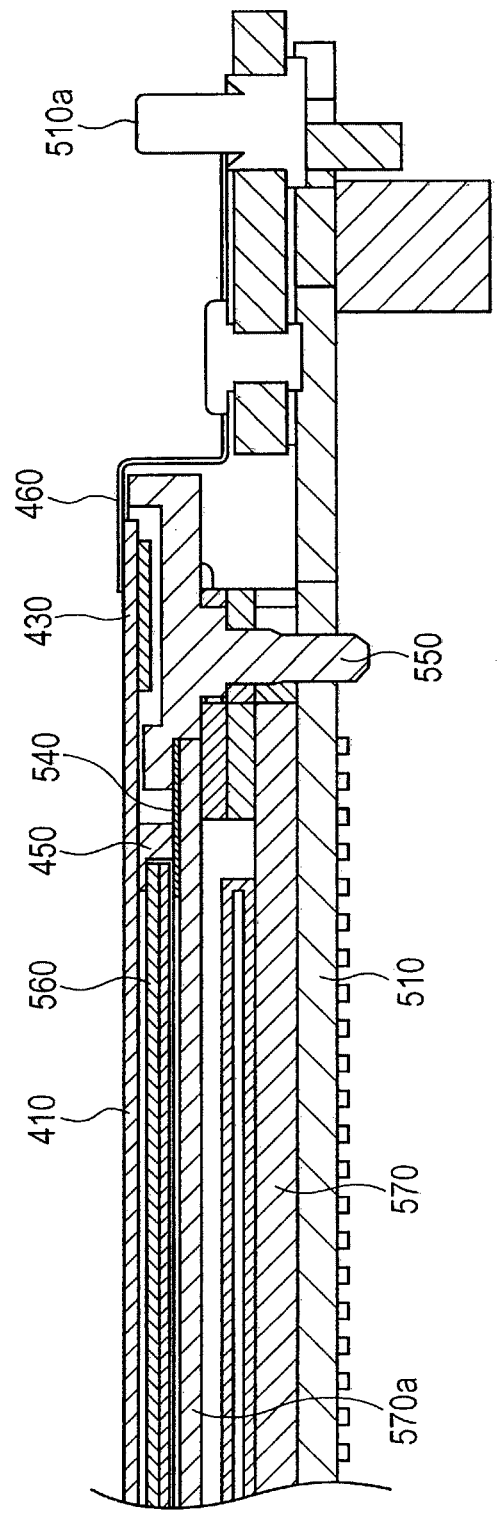
FIG. 11 is a cross-sectional view taken along line 11-11 of FIG. 9.

FIG. 10 is an exploded perspective view illustrating a configuration of the image pickup unit 400 of the digital single-lens reflex camera, which is the imaging device according to the exemplary embodiment of the present invention. FIG. 11 is a cross-sectional view taken along the line 11-11 of FIG. 9 (note that, a circuit board 520 and a shield case 530 are not illustrated).

The image pickup unit 400 roughly includes the dust removing device 470 and an image pickup element unit 500 including the image pickup element 570. The image pickup element unit 500 includes the image pickup element 570, an image pickup element holding member 510 for holding the image pickup element 570, the circuit board 520, the shield case 530, a light shielding member 540, an optical low-pass filter 560, and an optical low-pass filter holding member 550.

The image pickup element holding member 510 is made of a metal or the like, and includes right and left positioning pins 510*a* for positioning a pushing member 460 of the dust removing device 470, screw holes 510*b* for fixing the circuit board 520 and the shield case 530 with screws, and right and left screw holes 510*c* for fixing the pushing member 460 of the dust removing device 470 with screws.

An electric circuit of an imaging system is mounted on the circuit board 520, and the circuit board 520 is provided with clearance holes 520*a* for screws. The shield case 530 is made of a metal or the like and includes screw holes 530*a*. The circuit board 520 and the shield case 530 are locked to the image pickup element holding member 510 with screws through use of the clearance holes 520*a* for screws, the screw holes 530*a*, and the screw holes 510*b*. The shield case 530 is connected to a ground potential on the circuit for protecting the electric circuit from static electricity or the like.

The light shielding member 540 has an opening corresponding to an effective region of a photoelectric conversion surface of the image pickup element 570 and includes double-sided tapes on the subject side and the photographer side. The optical low-pass filter holding member 550 is fixed to and held by a cover glass 570*a* of the image pickup element 570 with the double-sided tape of the light shielding member 540 on the subject side. The optical low-pass filter 560 is positioned in an opening portion of the optical low-pass filter holding member 550 and fixed and held with the double-sided tape of the light shielding member 540 on the subject side.

On the other hand, a surface of the light shielding member 540 on the photographer side is fixed to and held by the cover glass 570*a* of the image pickup element 570 with the double-sided tape of the light shielding member 540 on the photographer side. This allows the light shielding member 540 to seal a region between the optical low-pass filter 560 and the cover glass 570*a* of the image pickup element 570 to form a sealed space for preventing a foreign matter such as dust from entering therein.

In this embodiment, the region between the optical low-pass filter 560 and the cover glass 570*a* of the image pickup element 570 is sealed with the light shielding member 540, and a sealed space for preventing a foreign matter such as dust from entering therein is formed in the region. However, in the present invention, the optical low-pass filter 560 and the light shielding member 540 are not necessarily required, and the dust removing device 470 may be set in the image pickup element unit 500 so as to sandwich a diaphragm 410 (described later) and the sealing member 450 through the intermediation of the cover glass 570*a* of the image pickup element 570. In this case, the region between the cover glass 570*a* and the dust removing device 470 is sealed with the sealing member 450, and a sealed space for preventing a foreign matter such as dust from entering therein is formed in the region.

Figure 12:
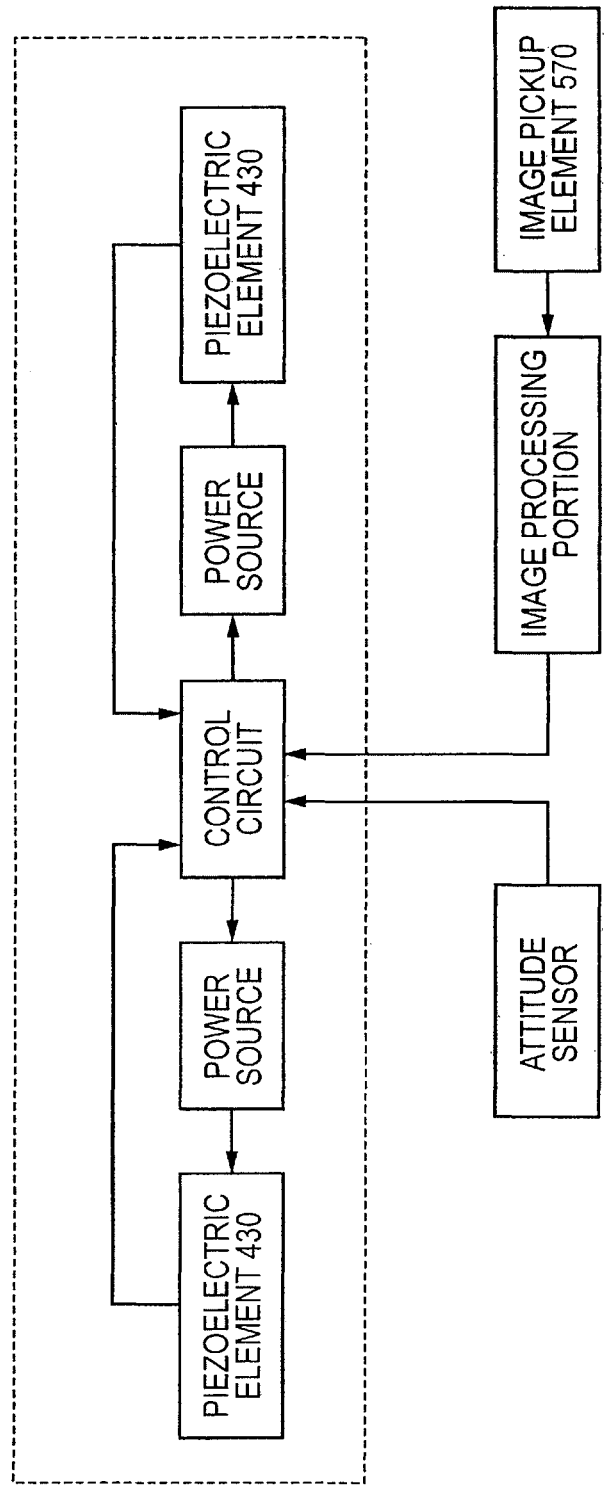
FIG. 12 is a block diagram illustrating an example of an electric configuration of the dust removing device of the present invention.

FIG. 12 is a block diagram illustrating an electrical configuration of the dust removing device 470 of the digital single-lens reflex camera, which is the imaging device according to the exemplary embodiment of the present invention. The dust removing device of the present invention is constituted by a control circuit, power sources, and piezoelectric elements to be driven, which are surrounded by a dotted line. The control circuit reads a voltage generated in a sensing electrode of the piezoelectric element 430 through a piezoelectric effect, detects an amplitude and a phase of vibration, and controls an amplitude, a frequency, and a temporal phase of an alternating voltage generated by the power source. In this embodiment, an attitude sensor and an image processing portion (described later) connected to the image pickup element unit 500 are connected to the control circuit of a vibration device. The attitude sensor detects an attitude of the dust removing device 470. The image processing portion performs an operation through use of an image captured by the image pickup element unit 500 regarding which position of the vibration member 410 dust adheres to. The power source applies an alternating voltage in a predetermined frequency range to the piezoelectric element 430.

The piezoelectric element 430 is driven with electric power supplied from the power source instructed by the control circuit as illustrated in FIG. 12. Then, stress is generated between the piezoelectric element 430 and the vibration member 410 due to the drive of the piezoelectric element 430 to generate flexural vibration in the vibration member 410. The dust removing device 470 of this embodiment removes dust adhering to the surface of the vibration member 410 through flexural vibration of the vibration member 410. The flexural vibration refers to elastic vibration for displacing the vibration member 410 in an optical axis direction, that is, a thickness direction of the vibration member 410.

Figure 13:
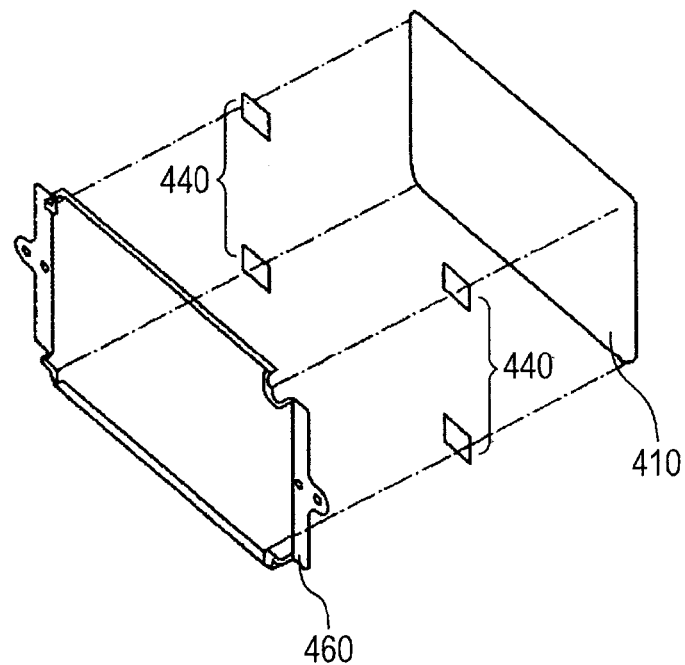
FIG. 13 is an exploded perspective view illustrating an example of a configuration of the dust removing device of the imaging device of the present invention.
Figure 14:
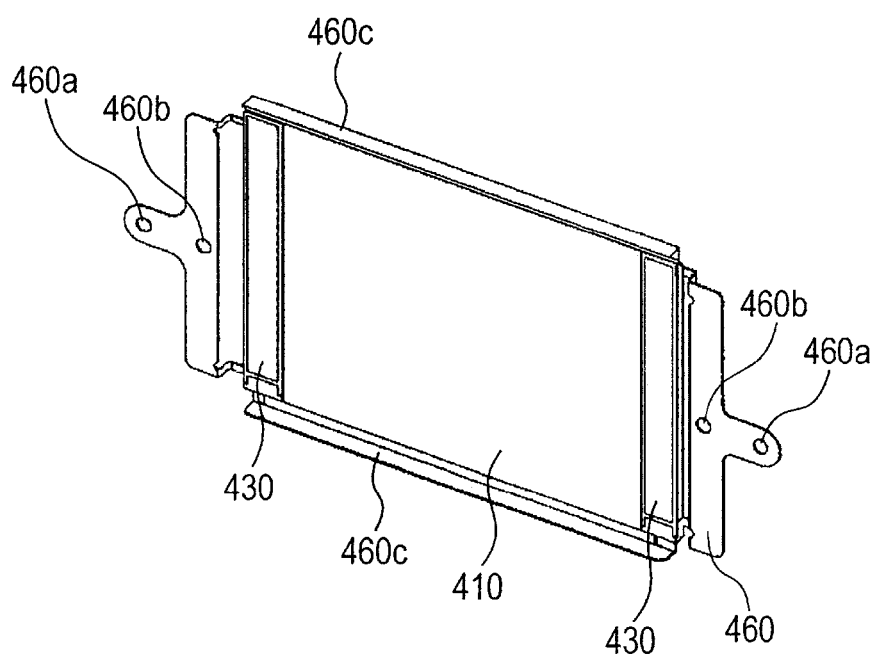
FIG. 14 is a view illustrating an example of the dust removing device of the imaging device of the present invention.

FIG. 13 is an exploded perspective view illustrating a configuration of the dust removing device 470 of the digital single-lens reflex camera, which is the imaging device according to the exemplary embodiment of the present invention (note that, the flexible printed board 420 connected to the piezoelectric element, the piezoelectric element 430, and the fixation member are not illustrated). FIG. 14 is a view illustrating the dust removing device 470 of FIG. 13 viewed from an opposite side from FIG. 13 (note that, the flexible printed board 420 connected to the piezoelectric element, adhesion members 440, and the fixation member are not illustrated).

The dust removing device 470 includes the vibration member 410, the flexible printed board 420 connected to the piezoelectric element, the piezoelectric element 430, and multiple fixation members respectively referred to as the adhesion members 440, the sealing member 450, and the pushing member 460.

The vibration member 410 is an optical member called an infrared cut filter for removing a high spatial frequency, and is a vibration member for generating flexural vibration in the vibration member 410 through drive of the piezoelectric element 430. The surface of the vibration member 410 is coated with a conductive material in order to prevent the adhesion of a foreign matter. In this embodiment, the vibration member 410 and the light receiving surface of the image pickup element 570 of the image pickup element unit 500 are arranged coaxially in this order.

However, the vibration member 410 of the dust removing device provided in the imaging device of the present invention is not necessarily limited to such a member. The vibration member of the present invention only needs to remove dust adhering to the surface through flexural vibration generated in the vibration member, and for example, may be an ultraviolet cut filter, an infrared/ultraviolet cut filter, the optical low-pass filter 560 of this embodiment (member in which multiple birefringent plates and phase plates made of quartz, lithium niobate single crystal, or the like are multilayered), or a member such as glass that does not have another optical function. Further, the surface of the vibration member 410 may be coated with a substance to which dust does not adhere easily in addition to a conductive material, or may not be treated as such.

As illustrated in FIG. 14, the piezoelectric element 430 is fixedly bonded to an end of the rectangular vibration member 410. In this embodiment, a total of two plate-shaped piezoelectric elements 430 are fixedly bonded to both ends of the vibration member 410. However, the present invention is not necessarily required to have such a configuration, and for example, one piezoelectric element 430 only needs to be provided on the vibration member 410.

The pushing member 460 is a frame-shaped fixation member having a function of fixing and holding the vibration member 410 to impart a biasing force to the vibration member 410. The dust removing device 470 is positioned with respect to the image pickup element unit 500 through use of positioning holes 460a of the pushing member 460 and positioning pins 510a of the image pickup element holding member 510. In this state, the dust removing device 470 is locked to the image pickup element unit 500 with screws so as to sandwich the vibration member 410 and the sealing member 450 through use of screw holes 460b of the pushing member 460 and the screw holes 510c.

As illustrated in FIG. 13, in this embodiment, the vibration member 410 is fixed to and held by the pushing member 460 through the intermediation of the adhesion members 440 in the vicinity of the four corners of the vibration member 410. The range of the vibration member 410 in which dust can be removed only needs to be a range in which a luminous flux entering an optical effective range of the image pickup element 570 passes. Thus, when the vibration member 410 is fixed to and held by the pushing member 460 in the vicinity of the four corners of the vibration member 410, dust can be removed efficiently without inhibiting vibration in the optical effective range of the digital camera. Further, the pushing member 460 is processed so as not to come into contact with members other than the adhesion members 440 so that the pushing member 460 and the vibration member 410 do not come into direct contact with each other to generate sound during vibration.

It is preferred that a conductive adhesive be used as the adhesion members 440. This enables electricity charged on the surface of the vibration member 410 coated with a conductive material to be released from the pushing member 410 to the circuit board 520 through the image pickup element holding member 510 and the shield case 530. Thus, dust can be prevented from adhering to the vibration member 410 effectively. Further, it is preferred that a conductive double-sided tape be used as the adhesion member 440. The conductive double-sided tape has a function as vibration absorption and an effect of not transmitting vibration to the pushing member 460. That is, the conductive double-sided tape can generate flexural vibration of the vibration member 410 more efficiently.

In this embodiment, the vibration member 410 is fixed to and held by the pushing member 460 through the intermediation of the adhesion members 440 in the vicinity of the four corners of the vibration member 410. However, the adhesion members 440 are not necessarily arranged in the vicinity of the four corners and may be arranged at any positions in any number as long as dust can be removed effectively without inhibiting vibration in the optical effective range. Preferably, a larger possible number of portions of the adhesion members 440 are in contact with nodes of flexural vibration of the vibration member 410. Further, in this embodiment, although the vibration member 410 is fixed to and held by the pushing member 460 through the intermediation of the four adhesion members 440, all the adhesion members 440 are not necessarily made of a conductive material and may be made of a non-conductive material. Preferably, as long as at least one of the adhesion members 440 is made of a conductive material, dust can be prevented from adhering to the vibration member 410 effectively for the above-mentioned reason.

In this embodiment, the pushing member 460 is formed as a single component through use of a material (conductive member) having a spring property (elasticity) such as a metal. However, the pushing member 460 is not necessarily required to have such a configuration, and for example, may be formed of multiple members. Further, a biasing force may be imparted by a member containing at least an organic high molecular compound component, instead of a metal or the like. In this case, the dust removing device 470 may be configured without including the adhesion members 440.

The sealing member 450 is formed of a resin or an elastomer, and serves as a vibration absorbing member of the vibration member 410 and forms a sealed space between the vibration member 410 and the optical low-pass filter 560, for preventing a foreign matter such as dust from entering therein. In order to enhance a vibration absorbing property of the vibration member 410, it is preferred that the sealing member 450 be formed of a thick member or a member having a small modulus of elasticity, and that a largest possible number of portions of the sealing member 450 be in contact with nodes of flexural vibration of the vibration member 410.

The surface of the sealing member 450 on the subject side comes into contact with the vibration member 410, and the surface of the sealing member 450 on the photographer side comes into contact with the optical low-pass filter 560. The vibration member 410 is biased to the image pickup element unit 500 side due to the spring property of the pushing member 460, and hence, the vibration member 410 closely contacts the sealing member 450 without any gap. Further, the sealing member 450 and the optical low-pass filter 560 also closely contact each other without any gap. Thus, the region between the vibration member 410 and the optical low-pass filter 560 is sealed with the sealing member 450, and a sealed space for preventing a foreign matter such as dust from entering therein is formed.

The sealing member 450 is biased to the image pickup element unit 500 side due to the spring property of the pushing member 460, and hence, it is not necessary to fix and hold the sealing member 450 with respect to the vibration member 410 and the optical low-pass filter 560 through use of an adhesive, a double-sided tape, or the like. However, in actual assembly, if it is preferred to fix and hold the sealing member 450 simply, the sealing member 450 may be fixed to or held by the vibration member 410 and the optical low-pass filter 560 through use of an adhesive, a double-sided tape, or the like. Conversely, the dust removing device of the present invention may be configured in such a manner that the sealing member 450 is fixed to and held by the vibration member 410 and the optical low-pass filter 560 through use of an adhesive, a double-sided tape, or the like without providing the pushing member 460.

The dust removing device of the present invention is set on a base, and the base in this embodiment refers to the image pickup element unit 500. The dust removing device 470 is locked to the image pickup element unit 500 that is a base with screws so as to sandwich the vibration member 410 and the sealing member 450 through use of the screw holes 460*b* of the pushing member 460 and the screw holes 510*c*.

As described above, the imaging device of this embodiment is an imaging device including at least the dust removing device and the image pickup element unit, in which the vibration member 410 of the dust removing device and the light receiving surface of the image pickup element unit are arranged coaxially in this order. As a result, only if dust on one side surface of the dust removing device can be removed, dust is not projected on the image pickup element. Further, in general, during photographing of a camera, the dust removing device is arranged in parallel with gravity, and hence, there is a very low possibility that dust which has been once removed adheres to the dust removing device again.

However, the base of the present invention is not necessarily required to be the image pickup element unit 500 and may be other members or components. For example, the base of the present invention only needs to be various imaging devices and image reading devices such as a digital camera main body, a digital video camera, a copier, a facsimile, and a scanner, and members and components therein.

Further, the fixation member containing at least a high molecular compound component in this embodiment is the adhesion member 440 and the sealing member 450. However, the fixation member of the present invention is not necessarily required to be the adhesion member 440 or the sealing member 450, and may be other members. For example, the fixation member may be the pushing member 460 or a member called a seal as in PTL 1, as long as the member contains at least a high molecular compound component. Further, for example, in the case where the dust removing device 470 is set so that the piezoelectric element 430 and the base are directly fixed and held via a sponge-shaped member that does not inhibit elastic vibration of the piezoelectric element 430 and flexural vibration of the vibration member 410, the sponge-shaped member, an adhesive for fixedly bonding the piezoelectric element 430 to the vibration member 410, and the like serve as fixation members. Further, for example, in the case of being biased to the base side through use of the flexible printed board 420, the flexible printed board 420 and members for bonding the flexible printed board 420 and the piezoelectric element 430 serve as fixation members.

Next, a method of producing the piezoelectric element 430, particularly, in the dust removing device 470 of the present invention is mainly described in detail through use of a plate-shaped piezoelectric element in the shape of a rectangular solid as illustrated in FIGS. 1A to 1C.

Although there is no particular limit to a method of producing the piezoelectric material 431 in the piezoelectric element 430 of the present invention, a general procedure of a piezoelectric ceramics involving sintering solid powder of an oxide, a carbonate, a nitrate, an oxalate, or the like containing constituent elements at normal pressures may be adopted.

Further, for example, in the case where the piezoelectric material 431 of the present invention contains, as its main component, a perovskite-type metal oxide represented by the following general formula (1): $(Ba_{1-x}Ca_x)(Ti_{1-y}Zr_y)O_3$ ($0.02 \leq x \leq 0.30$, $0.020 \leq y \leq 0.095$, and $y \leq x$), the metal oxide contains Mn, and a content of the Mn is 0.02 parts by weight or more and 0.40 parts by weight or less on a metal basis with respect to 100 parts by weight of the metal oxide, raw materials are formed of metal compounds such as a Ba compound, a Ca compound, a Ti compound, a Zr compound, and a Mn compound.

Examples of the usable Ba compound include barium oxide, barium carbonate, barium oxalate, barium acetate, barium nitrate, barium titanate, barium zirconate, and barium titanate zirconate.

Examples of the usable Ca compound include calcium oxide, calcium carbonate, calcium oxalate, calcium acetate, calcium titanate, and calcium zirconate.

Examples of the usable Ti compound include titanium oxide, barium titanate, barium titanate zirconate, and calcium titanate.

Examples of the usable Zr compound include zirconium oxide, barium zirconate, barium titanate zirconate, and calcium zirconate.

Examples of the usable Mn compound include manganese carbonate, manganese oxide, manganese dioxide, and manganese acetate.

Further, there is no particular limit to a raw material for adjusting "a" representing a ratio between a molar quantity of Ba and Ca at the A site of the piezoelectric material 431 of the present invention and a molar quantity of Ti and Zr at the B site thereof. The same effect is obtained through use of any one of the Ba compound, the Ca compound, the Ti compound, and the Zr compound.

Note that, the piezoelectric material 431 of the present invention is not necessarily required to be a piezoelectric ceramics containing barium titanate as its main component. Thus, a most preferred raw material and production method may be selected in accordance with the constituent elements.

There is no particular limit to a method of granulating precursor powder of the piezoelectric material 431 of the present invention. The method may involve granulating mixed powder obtained by mechanically mixing a Ba compound, a Ca compound, a Ti compound, a Zr compound, and a Mn compound. Alternatively, the method may involve calcining these compounds at about 800 to 1,300° C. and granulating thereafter. Alternatively, the method may involve calcining a Ba compound, a Ca compound, a Ti compound, and a Zr compound and adding a manganese compound to these compounds together with a binder. From the viewpoint that a grain diameter of granulated powder can be made more uniform, a most preferred granulation method is a spray dry method.

Examples of the binder that can be used for granulation include polyvinyl alcohol (PVA), polyvinyl butyral (PVB), and an acrylic resin. The amount of the binder to be added is preferably 1% by mass to 10% by mass, and more preferably 2% by mass to 5% by mass from the viewpoint of increasing the density of a compact.

There is no particular limit to a method of sintering the piezoelectric material 431 of the present invention. Examples of the sintering method include sintering using an electric furnace, sintering using a gas furnace, a conduction heating method, a microwave sintering method, a millimeter-wave sintering method, and a hot isostatic press (HIP). Sintering using an electric furnace and sintering using a gas furnace may be performed in a continuous furnace or a batch furnace.

Although there is no particular limit to a sintering temperature of the piezoelectric material 431, the sintering temperature is preferably set so that each compound reacts and is subjected to crystal growth sufficiently. A preferred sintering temperature is 1,200° C. or more and 1,550° C. or less, more preferably 1,300° C. or more and 1,480° C. or less, from the viewpoint of setting a grain diameter of ceramics in a range of 1 µm to 10 µm. The piezoelectric material 431 sintered in the above-mentioned temperature range exhibits satisfactory piezoelectric performance.

In order to stabilize the characteristics of the piezoelectric material 431 obtained by sintering with good reproducibility, the piezoelectric material 431 may be sintered for 2 hours or longer and 24 hours or shorter with the sintering temperature set constant in the above-mentioned range. Further, although a sintering method such as a two-stage sintering method may be used, a method involving no rapid change in temperature is preferred considering the productivity.

It is preferred to subject the piezoelectric material 431 to heat treatment at a temperature of 1,000° C. or higher after polishing the piezoelectric material 431. When the piezoelectric material 431 is polished mechanically, a residual stress is generated in the piezoelectric material 431. However, the residual stress is alleviated by subjecting the piezoelectric material 431 to heat treatment at a temperature of 1,000° C. or higher, and the piezoelectric characteristics of the piezoelectric material 431 become more satisfactory. Further, the heat treatment also has an effect of eliminating precursor powder such as barium carbonate precipitated in a grain boundary portion. Although there is no particular limit to a heat treatment time, 1 hour or longer is preferred.

There is no particular limit to a method of polarizing the piezoelectric element 430 of the present invention. The piezoelectric element 430 may be polarized in the atmosphere or silicon oil. Although a temperature for polarization is preferably 60° C. to 100° C., the optimum condition varies slightly depending on the composition of the piezoelectric material 431 constituting the piezoelectric element 430. An electric field to be applied for polarization is preferably 800 V/mm to 2.0 kV/mm.

A piezoelectric constant, a mechanical quality factor Qm, and a modulus of elasticity of the piezoelectric element 430 can be obtained by calculation from measurement results of a resonance frequency and an antiresonance frequency obtained through use of a commercially available impedance analyzer based on the standard of Electronic Materials Manufacturers Association of Japan (EMAS-6100). This method is generally called a resonance-antiresonance method.

In the following, the dust removing device of the present invention is specifically described with reference to Examples. However, the present invention is not limited by the following Examples.

A piezoelectric material used in a piezoelectric element of the present invention was produced.

Production Example 1

Barium titanate (BT-01 produced by Sakai Chemical Industry Co., Ltd.) having an average particle diameter of 100 nm, calcium titanate (CT-03 produced by Sakai Chemical Industry Co., Ltd.) having an average particle diameter of 300 nm, and calcium zirconate (CZ-03 produced by Sakai Chemical Industry Co., Ltd.) having an average particle diameter of 300 nm were weighed in a molar ratio of 83.0:10.5:6.5.

Next, these weighed powders were mixed by dry blending for 24 hours through use of a ball mill. In order to granulate the mixed powder thus obtained, manganese acetate (II) whose Mn weight was to be 0.18 parts by weight on a metal basis with respect to the mixed powder and a PVA binder that was to be 3 parts by weight with respect to the mixed powder were respectively allowed to adhere to the surface of the mixed powder through use of a spray dryer.

Next, the granulated powder thus obtained was filled in a mold and supplied with a compacting pressure of 200 MPa through use of a press forming apparatus to produce a disc-shaped compact. This compact may be further pressed through use of a cold isostatic press forming apparatus.

The compact thus obtained was placed in an electric furnace and held at a maximum temperature of 1,340° C. for 5 hours, and sintered in an atmospheric environment over a total of 24 hours.

Next, a composition of the compact was evaluated by fluorescent X-ray analysis. As a result, it was found that 0.18 parts by weight of Mn were contained in the composition represented by a chemical formula: $(Ba_{0.830}Ca_{0.170})(Ti_{0.935}Zr_{0.065})O_3$. This means that the weighed composition was matched with the sintered composition. Further, an amount of elements other than Ba, Ca, Ti, Zr, and Mn was 1 part by weight or less, which was equal to or lower than a detection limit.

Further, a crystal structure of the compact was analyzed by X-ray diffraction at 25° C. and −70° C. As a result, only a peak corresponding to a perovskite-type structure was observed. Further, as a result of subjecting the X-ray diffraction result to Rietveld analysis, it was found that the crystal structure was a tetragonal crystal phase at 25° C. and an orthorhombic crystal phase at −70° C.

Comparative Production Example 1

In order to granulate barium titanate (BT-01 produced by Sakai Chemical Industry Co., Ltd.) having an average particle diameter of 100 mm, manganese acetate (II) whose Mn weight was to be 0.12 parts by weight on a metal basis with respect to the mixed powder and a PVA binder that was to be 3 parts by weight with respect to the mixed powder were respectively allowed to adhere to the surface of the mixed powder through use of a spray dryer.

Next, the granulated powder thus obtained was filled in a mold and supplied with a compacting pressure of 200 MPa through use of a press forming apparatus to produce a disc-shaped compact. The compact thus obtained was placed in an electric furnace and held at a maximum temperature of 1,380° C. for 5 hours, and sintered in an atmospheric environment over a total of 24 hours.

Next, a composition of the compact was evaluated by fluorescent X-ray analysis. As a result, it was found that 0.12 parts by weight of Mn were contained in the composition represented by a chemical formula: $BaTiO_3$. Further, an amount of elements other than Ba, Ca, Ti, Zr, and Mn was 1 part by weight or less, which was equal to or lower than a detection limit.

Further, a crystal structure of the compact was analyzed by X-ray diffraction at 25° C. and −70° C. As a result, only a peak corresponding to a perovskite-type structure was observed. Further, as a result of subjecting the X-ray diffraction result to Rietveld analysis, it was found that the crystal structure was a tetragonal crystal phase at 25° C. and an orthorhombic crystal phase at −70° C.

Comparative Production Example 2

A sintered body of lead zirconate titanate was prepared. Further, a crystal structure of the sintered body was analyzed by X-ray diffraction at 25° C. and −70° C. As a result, only a peak corresponding to a perovskite-type structure was observed. Further, as a result of subjecting the X-ray diffraction result to Rietveld analysis, it was found that the crystal structure was a tetragonal crystal phase at 25° C. and a tetragonal crystal phase also at −70° C.

Example 1 and Comparative Example 1

Piezoelectric elements of Example 1 and Comparative Example 1 were produced using the piezoelectric materials of Production Example 1 and Comparative Production Example 1.

Each piezoelectric material was polished to a thickness of 0.5 mm, and Ti and Au were formed to thicknesses of 30 nm and 380 nm respectively in this order on two surfaces of the material by DC magnetron sputtering to obtain a piezoelectric element having a first electrode and a second electrode.

Next, the piezoelectric elements were cut to dimensions of 10.0 mm×2.5 mm×0.5 mm, and thereafter, were polarized through use of a DC power source. A temperature was 100° C., an applied electric field was 1 kV/mm, and a voltage application time was 30 minutes. In this case, the polarization axis directions of the piezoelectric elements were parallel to a film thickness direction.

Further, a minute alternating electric field was applied to the piezoelectric elements of Example 1 and Comparative Example 1 with varying measurement temperature to measure a dielectric constant, and a phase transition temperature T was evaluated. As a result, the phase transition temperature T was −32° C. and 6° C. respectively in Example 1 and Comparative Example 1.

Comparative Example 2

A piezoelectric element of Comparative Example 2 was produced using the piezoelectric material of Comparative Production Example 2.

The piezoelectric material was polished to a thickness of 0.25 mm, and Ti and Au were formed to thicknesses of 30 nm and 380 nm respectively in this order on two surfaces of the material by DC magnetron sputtering to obtain a piezoelectric element having a first electrode and a second electrode.

Next, the piezoelectric element was cut to dimensions of 10.0 mm×2.5 mm×0.5 mm, and thereafter, was polarized through use of a DC power source. A temperature was 200° C., an applied electric field was 1.7 kV/mm, and a voltage application time was 30 minutes. In this case, the polarization axis direction of the piezoelectric element was parallel to a film thickness direction.

Further, a minute alternating electric field was applied to the piezoelectric element of Comparative Example 2 with varying measurement temperature to measure a dielectric constant, and a phase transition temperature T was evaluated. As a result, the phase transition temperature T was not present at least in a range of −60° C. to 50° C.

(Evaluation of Piezoelectric Elements of Example 1 and Comparative Examples 1 and 2)

Figure 15:
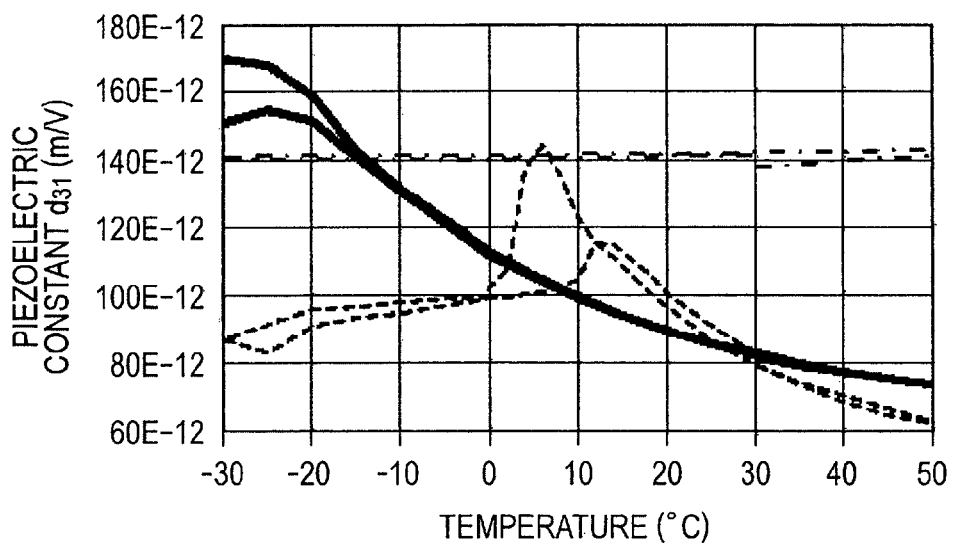
FIG. 15 is a graph showing temperature dependence of a piezoelectric constant $d_{31}$ of piezoelectric elements of Example 1 and Comparative Examples 1 and 2.
Figure 16:
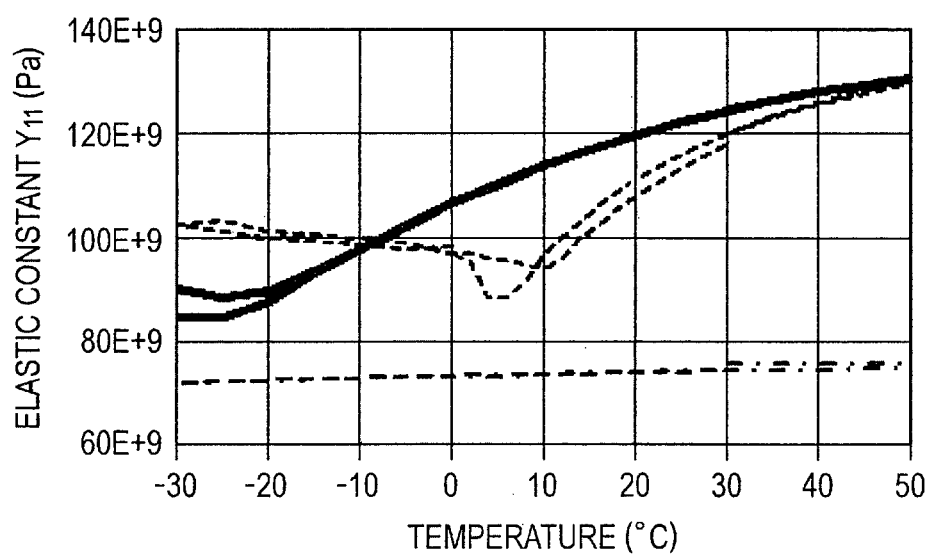
FIG. 16 is a graph showing temperature dependence of an elastic constant $Y_{11}$ of the piezoelectric elements of Example 1 and Comparative Examples 1 and 2.
Figure 17:
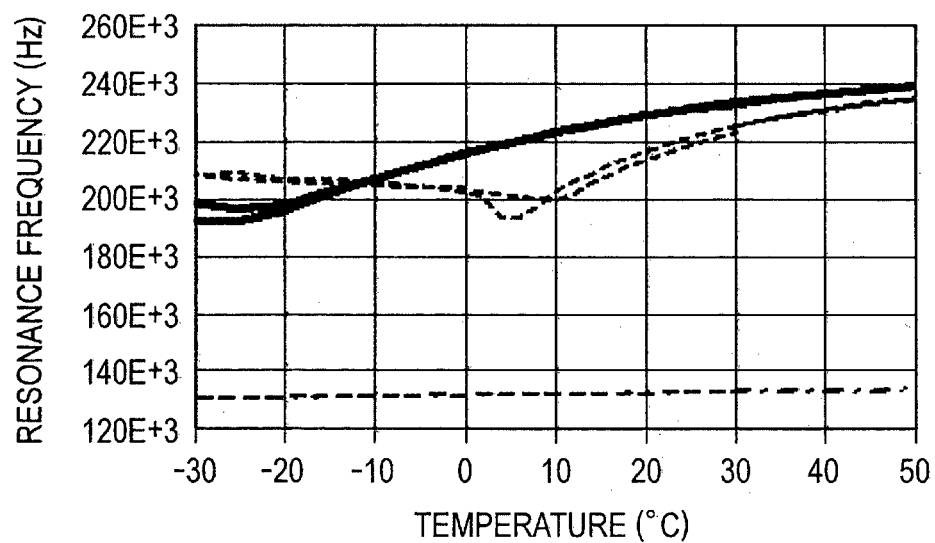
FIG. 17 is a graph showing temperature dependence of a resonance frequency of the piezoelectric elements of Example 1 and Comparative Examples 1 and 2.

Next, a piezoelectric constant $d_{31}$, an elastic constant $Y_{11}$, and a resonance frequency of each of the piezoelectric elements of Example 1 and Comparative Examples 1 and 2 were obtained by a resonance-antiresonance method. FIGS. 15, 16, and 17 show the respective results. In this case, a solid line shows a result of the piezoelectric element of Example 1, a dotted line shows a result of the piezoelectric element of Comparative Example 1, and an alternate long and short dash line shows a result of the piezoelectric element of Comparative Example 2. FIGS. 15, 16, and 17 all show measurement results obtained by starting the measurement at 30° C. and changing the temperature in the order of an increase, a decrease, and an increase to 30° C. The measurement was performed in a constant temperature reservoir. The constant temperature reservoir was held at each temperature for a predetermined period of time, and after the temperature became stable, a piezoelectric constant $d_{31}$, an elastic constant $Y_{11}$, and a resonance frequency at each temperature were evaluated. In FIGS. 15, 16, and 17, in the piezoelectric elements of Example 1 and Comparative Example 1, changes in the piezoelectric constant $d_{31}$, the elastic constant $Y_{11}$, and the resonance frequency with respect to the temperature varied between the increase in temperature and the decrease in temperature. This is because, a ferroelectric material caused a slight difference in temperature between a phase transition temperature (phase transition temperature during a decrease in temperature) from a first ferroelectric crystal phase to a second ferroelectric crystal phase and a phase transition temperature (phase transition temperature during an increase in temperature) from the second ferroelectric crystal phase to the first ferroelectric crystal phase. In this case, when the phase transition temperature (phase transition temperature during a decrease in temperature) from the first ferroelectric crystal phase to the second ferroelectric crystal phase is compared with the phase transition temperature (phase transition temperature during an increase in temperature) from the second ferroelectric crystal phase to the first ferroelectric crystal phase, the phase transition temperature (phase transition temperature during a decrease in temperature) from the first ferroelectric crystal phase to the second ferroelectric crystal phase is lower. On the other hand, in the piezoelectric element of Comparative Example 2, a phase transition temperature T was not present at least in the range of −60° C. to 50° C. Therefore, changes in the piezoelectric constant $d_{31}$, the elastic constant $Y_{11}$, and the resonance frequency with respect to the temperature did not become extreme between the increase in temperature and the decrease in temperature, and the piezoelectric constant $d_{31}$, the elastic constant $Y_{11}$, and the resonance frequency were almost the same values between the increase in temperature and the decrease in temperature with respect to most of the temperatures.

In this case, as the piezoelectric element of Example 1 decreased in temperature, a piezoelectric constant increased, an elastic constant decreased, and a resonance frequency decreased. On the other hand, in the piezoelectric element of Comparative Example 1, an inflection point of characteristics was present in the vicinity of 5° C., a piezoelectric constant became largest in the vicinity of 5° C., an elastic constant became lowest, and a resonance frequency became lowest. Further, in the piezoelectric element of Comparative Example 2, each physical property was almost constant without depending on the temperature.

Production Examples 2 to 27

Barium titanate (BT-01 produced by Sakai Chemical Industry Co., Ltd.) having an average particle diameter of 100 nm, calcium titanate (CT-03 produced by Sakai Chemical Industry Co., Ltd.) having an average particle diameter of 300 nm, and calcium zirconate (CZ-03 produced by Sakai Chemical Industry Co., Ltd.) having an average particle diameter of 300 nm were weighed to obtain a molar ratio shown in Table 1.

Next, these weighed powders were mixed by dry blending for 24 hours through use of a ball mill. In order to granulate the mixed powder thus obtained, manganese acetate (II) whose Mn weight was to be parts by weight shown in Table 1 on a metal basis with respect to the mixed powder and a PVA binder that was to be 3 parts by weight with respect to the mixed powder were respectively allowed to adhere to the surface of the mixed powder through use of a spray dryer.

Next, the granulated powder thus obtained was filled in a mold and supplied with a compacting pressure of 200 MPa through use of a press forming apparatus to produce a disc-shaped compact. This compact may be further pressed through use of a cold isostatic press forming apparatus.

The compact thus obtained was placed in an electric furnace and held at a maximum temperature of 1,330° C. to 1,480° C. for 5 hours, and sintered in an atmospheric environment over a total of 24 hours. Note that, the maximum pressure in Production Example 10 was 1,330° C., the maximum pressure in Production Example 11 was 1,440° C., and the maximum pressure in Production Example 12 was 1,400° C.

Next, a composition of the compact was evaluated by fluorescent X-ray analysis. As a result, it was found that parts by weight of Mn shown in Table 1 were contained in the composition represented by a chemical formula: $(Ba_{1-x}Ca_x)(Ti_{1-y}Zr_y)O$, where x and y are shown in Table 2. Further, an amount of elements other than Ba, Ca, Ti, Zr, and Mn was 1 part by weight or less, which was equal to or lower than a detection limit.

Further, a crystal structure of the compact was analyzed by X-ray diffraction at 25° C. and −70° C. As a result, only a peak corresponding to a perovskite-type structure was observed in every example. Further, as a result of subjecting the X-ray diffraction result to Rietveld analysis, it was found that the crystal structure was a tetragonal crystal phase at 25° C. and an orthorhombic crystal phase at −70° C. in every example.

Examples 2 to 27

Piezoelectric elements of Examples 2 to 27 were produced using the piezoelectric materials of Production Examples 2 to 27.

Each piezoelectric material was polished to a thickness of 0.5 mm, and Ti and Au were formed to thicknesses of 30 nm and 380 nm respectively in this order on two surfaces of the material by DC magnetron sputtering to obtain a piezoelectric element having a first electrode and a second electrode.

Next, the piezoelectric elements were cut to dimensions of 10.0 mm×2.5 mm×0.5 mm, and thereafter, were polarized through use of a DC power source. A temperature was 100° C., an applied electric field was 1 kV/mm, and a voltage application time was 30 minutes. In this case, the polarization axis directions of the piezoelectric elements were parallel to a film thickness direction.

Further, a minute alternating electric field was applied to the piezoelectric elements of Examples 2 to 27 with varying measurement temperature to measure a dielectric constant, and a phase transition temperature T was evaluated. As a result, the phase transition temperature T was as shown in Table 2. Table 2 also shows the result of the phase transition temperature T of each piezoelectric element of Example 1 and Comparative Example 1. The phase transition temperature T was evaluated by applying a minute alternating electric field to the piezoelectric element while changing the measurement temperature to measure a dielectric constant in the same way as in Examples 2 to 27.

TABLE 1

| | $BaTiO_3$ [mol] | $CaTiO_3$ [mol] | $CaZrO_3$ [mol] | Mn parts by weight [% by weight] |
|---|---|---|---|---|
| Production Example 1 | 83.00 | 10.50 | 6.50 | 0.18 |
| Production Example 2 | 84.50 | 11.40 | 4.10 | 0.18 |
| Production Example 3 | 87.00 | 8.90 | 4.10 | 0.18 |
| Production Example 4 | 85.75 | 9.75 | 4.50 | 0.18 |
| Production Example 5 | 87.00 | 8.00 | 5.00 | 0.18 |
| Production Example 6 | 85.00 | 10.00 | 5.00 | 0.18 |
| Production Example 7 | 86.00 | 8.00 | 6.00 | 0.18 |
| Production Example 8 | 86.00 | 8.00 | 6.00 | 0.16 |
| Production Example 9 | 86.00 | 8.00 | 6.00 | 0.14 |
| Production Example 10 | 81.30 | 12.70 | 6.00 | 0.24 |
| Production Example 11 | 91.00 | 5.00 | 4.00 | 0.08 |
| Production Example 12 | 81.30 | 12.70 | 6.00 | 0.24 |
| Production Example 13 | 83.00 | 10.10 | 6.90 | 0.18 |
| Production Example 14 | 83.00 | 11.00 | 6.00 | 0.18 |
| Production Example 15 | 84.00 | 10.10 | 5.90 | 0.18 |
| Production Example 16 | 87.00 | 7.00 | 6.00 | 0.15 |
| Production Example 17 | 84.00 | 11.00 | 5.00 | 0.18 |
| Production Example 18 | 83.00 | 10.10 | 6.90 | 0.18 |
| Production Example 19 | 83.00 | 10.50 | 6.50 | 0.18 |
| Production Example 20 | 83.00 | 11.00 | 6.00 | 0.18 |
| Production Example 21 | 84.00 | 10.10 | 5.90 | 0.18 |
| Production Example 22 | 84.00 | 10.50 | 5.50 | 0.18 |
| Production Example 23 | 84.00 | 11.00 | 5.00 | 0.18 |
| Production Example 24 | 83.00 | 10.10 | 6.90 | 0.24 |
| Production Example 25 | 83.00 | 10.10 | 6.90 | 0.30 |
| Production Example 26 | 84.00 | 10.10 | 5.90 | 0.24 |
| Production Example 27 | 84.00 | 10.10 | 5.90 | 0.30 |
| Comparative Production Example 1 | 100.00 | 0.00 | 0.00 | 0.12 |

TABLE 2

| | | x | y | Mn parts by weight [% by weight] | Auxiliary component [% by weight] | Phase transition temperature after polarization [° C.] |
|---|---|---|---|---|---|---|
| Example 1 | Production Example 1 | 0.1700 | 0.065 | 0.18 | 0.0 | −32 |
| Example 2 | Production Example 2 | 0.1550 | 0.041 | 0.18 | 0.0 | −46 |
| Example 3 | Production Example 3 | 0.1300 | 0.041 | 0.18 | 0.0 | −40 |
| Example 4 | Production Example 4 | 0.1425 | 0.045 | 0.18 | 0.0 | −44 |
| Example 5 | Production Example 5 | 0.1300 | 0.050 | 0.18 | 0.0 | −29 |
| Example 6 | Production Example 6 | 0.1500 | 0.050 | 0.18 | 0.0 | −44 |
| Example 7 | Production Example 7 | 0.1400 | 0.060 | 0.18 | 0.0 | −20 |
| Example 8 | Production Example 8 | 0.1400 | 0.060 | 0.16 | 0.0 | −16 |
| Example 9 | Production Example 9 | 0.1400 | 0.060 | 0.14 | 0.0 | −16 |
| Example 10 | Production Example 10 | 0.1870 | 0.060 | 0.24 | 0.0 | −38 |
| Example 11 | Production Example 11 | 0.0900 | 0.040 | 0.08 | 0.0 | −7 |
| Example 12 | Production Example 12 | 0.1870 | 0.060 | 0.24 | 0.0 | −60 |
| Example 13 | Production Example 13 | 0.1700 | 0.069 | 0.18 | 0.0 | −24 |
| Example 14 | Production Example 14 | 0.1700 | 0.060 | 0.18 | 0.0 | −34 |
| Example 15 | Production Example 15 | 0.1600 | 0.059 | 0.18 | 0.0 | −38 |
| Example 16 | Production Example 16 | 0.1300 | 0.060 | 0.15 | 0.0 | −5 |
| Example 17 | Production Example 17 | 0.1600 | 0.050 | 0.18 | 0.0 | −52 |
| Example 18 | Production Example 18 | 0.1700 | 0.069 | 0.18 | 0.0 | −26 |
| Example 19 | Production Example 19 | 0.1700 | 0.065 | 0.18 | 0.0 | −36 |
| Example 20 | Production Example 20 | 0.1700 | 0.060 | 0.18 | 0.0 | −40 |
| Example 21 | Production Example 21 | 0.1600 | 0.059 | 0.18 | 0.0 | −36 |
| Example 22 | Production Example 22 | 0.1600 | 0.055 | 0.18 | 0.0 | −40 |
| Example 23 | Production Example 23 | 0.1600 | 0.050 | 0.18 | 0.0 | −50 |
| Example 24 | Production Example 24 | 0.1700 | 0.069 | 0.24 | 0.0 | −20 |
| Example 25 | Production Example 25 | 0.1700 | 0.069 | 0.30 | 0.0 | −20 |
| Example 26 | Production Example 26 | 0.1600 | 0.059 | 0.24 | 0.0 | −42 |
| Example 27 | Production Example 27 | 0.1600 | 0.059 | 0.30 | 0.0 | −42 |
| Comparative Example 1 | Comparative Production Example 1 | 0.0000 | 0.000 | 0.12 | 0.0 | 6 |

Production Example 28

Potassium carbonate (produced by Kishida Chemical Co., Ltd.), sodium carbonate (produced by Kishida Chemical Co., Ltd.), lithium carbonate (produced by Kishida Chemical Co., Ltd.), and niobium oxide (produced by Kojundo Chemical Laboratory Co., Ltd.) each having a purity of 99.9% were weighed so as to have a composition represented by a chemical formula:

$(K_{0.46}Na_{0.46}Li_{0.08})NbO_3$.

Next, the weighed powders were mixed in alcohol by wet blending for 24 hours through use of a ball mill. The mixed powder was dried, and thereafter, calcined at 800° C. for 4 hours. The calcined powder thus obtained was crushed through use of an agate mortar, and a PVB binder to be 3 parts by weight was mixed in the calcined powder. Then, the mixture was subjected to wet crushing for 24 hours through use of a ball mill. The resultant crushed powder was dried at 80° C. for 12 hours and passed through a 40-mesh sieve to obtain granulated powder.

Next, the granulated powder thus obtained was filled in a mold and supplied with a compacting pressure of 200 MPa through use of a press forming apparatus to produce a disc-shaped compact.

The compact thus obtained was placed in an electric furnace and held at a maximum temperature of 1,120° C. for 5 hours, and sintered in an atmospheric environment over a total of 24 hours.

Next, a composition was evaluated by ICP emission spectrochemical analysis. The composition was evaluated through use of a sintered body for composition evaluation. As a result, it was found that the composition was represented by $(K_{0.46}Na_{0.46}Li_{0.08})NbO_3$. This means that the weighed composition was matched with the sintered composition.

Further, a crystal structure of the sintered body was analyzed by X-ray diffraction at 25° C. and −70° C. As a result, only a peak corresponding to a perovskite-type structure was observed. Further, as a result of subjecting the X-ray diffraction result to Rietveld analysis, it was found that the crystal structure was an orthorhombic crystal phase at 25° C. and a rhombohedral crystal phase at −70° C.

Example 28

A piezoelectric element of Example 28 was produced using the piezoelectric material of Production Example 28.

The same procedure as that of Example 1 was followed until the piezoelectric element was cut to dimensions of 10.0 mm×2.5 mm×0.5 mm to obtain the piezoelectric element of Example 28.

Next, the piezoelectric element was polarized through use of a DC power source. The piezoelectric element was placed in silicon oil, a temperature was 120° C., an applied electric field was 4 kV/mm, and a voltage application time was 30 minutes. In this case, the polarization axis direction of the piezoelectric element was parallel to a film thickness direction.

Further, a minute alternating electric field was applied to the piezoelectric element of Example 28 with varying measurement temperature to measure a dielectric constant, and a phase transition temperature T was evaluated. As a result, the phase transition temperature T was −35° C.

Production Example 29

Potassium carbonate (produced by Kishida Chemical Co., Ltd.), sodium carbonate (produced by Kishida Chemical Co., Ltd.), lithium carbonate (produced by Kishida Chemical Co., Ltd.), and niobium oxide (produced by Kojundo Chemical Laboratory Co., Ltd.) each having a purity of 99.9% were weighed so as to have a composition represented by a chemical formula:

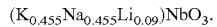

$(K_{0.455}Na_{0.455}Li_{0.09})NbO_3$.

Next, the same procedure as that of Production Example 28 was performed up to sintering to obtain a sintered body.

Next, a composition was evaluated by ICP emission spectrochemical analysis. The composition was evaluated through use of a sintered body for composition evaluation. As a result, it was found that the composition was represented by $(K_{0.455}Na_{0.455}Li_{0.09})NbO_3$. This means that the weighed composition was matched with the sintered composition.

Further, a crystal structure of the sintered body was analyzed by X-ray diffraction at 25° C. and −70° C. As a result, only a peak corresponding to a perovskite-type structure was observed. Further, as a result of subjecting the X-ray diffraction result to Rietveld analysis, it was found that the crystal structure was an orthorhombic crystal phase at 25° C. and a rhombohedral crystal phase at −70° C.

Example 29

Piezoelectric element of Example 29 was produced using the piezoelectric material of Production Example 29.

The same procedure as that of Example 1 was followed until the piezoelectric element was cut to dimensions of 10.0 mm×2.5 mm×0.5 mm to obtain the piezoelectric element of Example 29.

Next, the piezoelectric element was polarized in the same procedure as that of Example 28.

Further, a minute alternating electric field was applied to the piezoelectric element of Example 29 with varying measurement temperature to measure a dielectric constant, and a phase transition temperature T was evaluated. As a result, the phase transition temperature T was −65° C.

Production Example 30

Barium titanate (BT-01 produced by Sakai Chemical Industry Co., Ltd.) having an average particle diameter of 100 nm and barium zirconate (produced by Nippon Chemical Industrial Co., Ltd.) having an average particle diameter of 300 nm were weighed in a molar ratio of 97.0:3.0.

Next, these weighed powders were mixed by dry blending for 24 hours through use of a ball mill. In order to granulate the mixed powder thus obtained, manganese acetate (II) whose Mn weight was to be 0.12 parts by weight on a metal basis with respect to the mixed powder and a PVA binder that was to be 3 parts by weight with respect to the mixed powder were respectively allowed to adhere to the surface of the mixed powder through use of a spray dryer.

Next, a compact was produced in the same procedure as that of Example 1 and sintered in an atmospheric environment.

Next, a composition of the sintered body was evaluated by fluorescent X-ray analysis. As a result, it was found that 0.12 parts by weight of Mn were contained in the composition represented by a chemical formula: $Ba(Ti_{0.970}Zr_{0.030})$. This means that the weighed composition was matched with the sintered composition. Further, an amount of elements other than Ba, Ti, Zr, and Mn was 1 part by weight or less, which was equal to or lower than a detection limit.

Further, a crystal structure of the sintered body was analyzed by X-ray diffraction at 25° C. and −70° C. As a result, only a peak corresponding to a perovskite-type structure was observed. Further, as a result of subjecting the X-ray diffraction result to Rietveld analysis, it was found that the crystal structure was an orthorhombic crystal phase at 25° C. and a rhombohedral crystal phase at −70° C.

Example 30

A piezoelectric element of Example 30 was produced using the piezoelectric material of Production Example 30.

The same procedure as that of Example 1 was followed until the piezoelectric element was cut to dimensions of 10.0 mm×2.5 mm×0.5 mm to obtain the piezoelectric element of Example 30.

Next, the piezoelectric element was polarized through use of a DC power source. A temperature was 110° C., an applied electric field was 1 kV/mm, and a voltage application time was 30 minutes. In this case, the polarization axis direction of the piezoelectric element was parallel to a film thickness direction.

Further, a minute alternating electric field was applied to the piezoelectric element with varying measurement temperature to measure a dielectric constant, and a phase transition temperature T was evaluated. As a result, the phase transition temperature T was −55° C.

Example 31 and Comparative Example 3

Image pickup units including dust removing devices of Example 31 and Comparative Example 3 as illustrated in FIG. 10 were produced through use of the piezoelectric materials of Production Example 1 and Comparative Production Example 1.

Each piezoelectric material was polished to a thickness of 0.25 mm, and Ti and Au were patterned to thicknesses of 30 nm and 380 nm respectively in this order on two surfaces of the material by DC magnetron sputtering to obtain a piezoelectric element having a first electrode and a second electrode. In addition, the piezoelectric elements were cut to dimensions of 33.3 mm×4.0 mm×0.25 mm, and a routing electrode was patterned in the order of Ti and Au by the DC magnetron sputtering described above, and thereby, the first electrode on a first electrode surface and the first electrode on a second electrode surface were short-circuited via one surface of 4.0×0.25 mm of the piezoelectric material. At this time, it was confirmed that the first electrode and the second electrode were not short-circuited, and thus, a piezoelectric element as illustrated in FIGS. 1A to 1C was produced.

Next, the piezoelectric elements were polarized through use of a DC power source. A temperature was 100° C., an applied electric field was 1 kV/mm, and a voltage application time was 30 minutes.

Next, two piezoelectric elements produced from Production Example 1 and Comparative Production Example 1 were attached along a side of 33.7 mm of a glass plate having dimensions of 50.8×33.7×0.3 mm, which serves as an infrared cut filter, through use of an epoxy resin-based adhesive. The adhesion surface of the piezoelectric element was the first electrode surface.

Next, a flexible printed board was attached to a portion of each piezoelectric element in which the first electrode and the second electrode of the second electrode surface were present through use of a conductive adhesive. The first electrode and the second electrode of each piezoelectric element were electrically connected to a camera main body through the intermediation of the flexible printed board so as to allow an alternating voltage to be applied from a power source to the piezoelectric element.

Next, an infrared cut filter having the above-mentioned piezoelectric element was screwed to the image pickup element unit illustrated in FIG. 10 including a CMOS sensor, with a front surface on a subject side being an optical low-pass filter, as illustrated in FIG. 10, through use of a sealing member made of polyurethane foam, a pushing member made of stainless steel, and adhesion members (one of which was a conductive double-sided tape and three of which were double-sided tapes) to produce image pickup units including the dust removing devices of Example 31 and Comparative Example 3.

In this case, a storage elastic modulus G' of polyurethane foam evaluated by dynamic viscoelasticity analysis (DMA) was 10 MPa at −5° C. and 0.1 MPa at 25° C.

Comparative Example 4

An image pickup unit including a dust removing device of Comparative Example 4 as illustrated in FIG. 10 was produced through use of the piezoelectric material of Comparative Production Example 1.

The piezoelectric material was polished to a thickness of 0.25 mm, and Ti and Au were patterned to thicknesses of 30 nm and 380 nm respectively in this order on two surfaces of the material by DC magnetron sputtering to obtain a piezoelectric element having a first electrode and a second electrode. In addition, the piezoelectric elements were cut to dimensions of 33.3 mm×4.0 mm×0.25 mm, and a routing electrode was patterned in the order of Ti and Au by the DC magnetron sputtering described above, and thereby, the first electrode on a first electrode surface and the first electrode on a second electrode surface were short-circuited via one surface of 4.0×0.25 mm of the piezoelectric material. At this time, it was confirmed that the first electrode and the second electrode were not short-circuited, and thus, a piezoelectric element as illustrated in FIGS. 1A to 1C was produced.

Next, the piezoelectric element was polarized through use of a DC power source. A temperature was 200° C., an applied electric field was 1.7 kV/mm, and a voltage application time was 30 minutes.

Next, two piezoelectric elements were attached along a side of 33.7 mm of a glass plate having dimensions of 50.8×33.7×0.3 mm, which serves as an infrared cut filter, through use of an epoxy resin-based adhesive. The adhesion surface of the piezoelectric element was the first electrode surface.

Next, a flexible printed board was attached to a portion of each piezoelectric element in which the first electrode and the second electrode of the second electrode surface were present through use of a conductive adhesive. The first electrode and the second electrode of each piezoelectric element were electrically connected to a camera main body through the intermediation of the flexible printed board so as to allow an alternating voltage to be applied from a power source to the piezoelectric element.

Next, an infrared cut filter having the above-mentioned piezoelectric element was screwed to the image pickup element unit illustrated in FIG. 10 including a CMOS sensor, with a front surface on a subject side being an optical low-pass filter, as illustrated in FIG. 10, through use of a sealing member made of polyurethane foam, a pushing member made of stainless steel, and adhesion members (one of which was a conductive double-sided tape and three of which were double-sided tapes) to produce an image pickup unit including the dust removing device of Comparative Example 4.

(Evaluation of Dust Removal Performance of Image Pickup Units Including Dust Removing Devices of Example 31 and Comparative Examples 3 and 4)

Next, a mechanical admittance and a resonance frequency of image pickup units including the dust removing devices of Example 31 and Comparative Examples 3 and 4 were measured. The measurements were evaluated by placing the image pickup unit including the dust removing device in an environment box capable of being varied in temperature freely through use of Precision Impedance Analyzer 4294A produced by Agilent Technologies. A measurement frequency was set in a range of 105 to 120 kHZ, and the measurement was performed in increments of 5° in the order of 25° C. to 50° C. to −30° C. to 25° C. in a range of −30° C. to 50° C. An in-phase alternating electric field was applied to the right and left piezoelectric elements as well as the image pickup units including the dust removing devices of Example 31 and Comparative Examples 3 and 4, and the nineteenth standing wave vibration mode was formed on the diaphragm in the above-mentioned frequency range.

The mechanical admittance refers to an absolute value of an admittance obtained by removing a parallel capacitance component (electric capacitance component) of an equivalent circuit from the equivalent circuit of a piezoelectric vibrator described in the standard of Electronic Materials Manufacturers Association of Japan (EMAS-6100). As is understood from the fact that dynamic characteristics of a mechanical system is generally analyzed electrically by being replaced by a mechanical circuit, the magnitude of a mechanical admittance is proportional to the magnitude of an amplitude of a vibration mode of the dust removing device. That is, for example, the magnitude of the mechanical admittance is a value proportional to a result obtained by measuring the surface of the diaphragm of the dust removing device with a laser Doppler vibrometer.

Specifically, the mechanical admittance is a value obtained as a square root of a sum of a square of a result obtained by decomposing an admittance at each frequency obtained in the measurement into a real part and an imaginary part through use of a phase at each frequency and subtracting a value obtained by multiplying an electric capacitance of the piezoelectric element calculated from a relative dielectric constant of the piezoelectric element at 1 kHz by an angular velocity at each frequency from the imaginary part, and a square of the real part.

Further, a resonance frequency was set to a frequency number at which a mechanical admittance showed a maximum value in a range of 105 to 120 kHZ.

Figure 18:
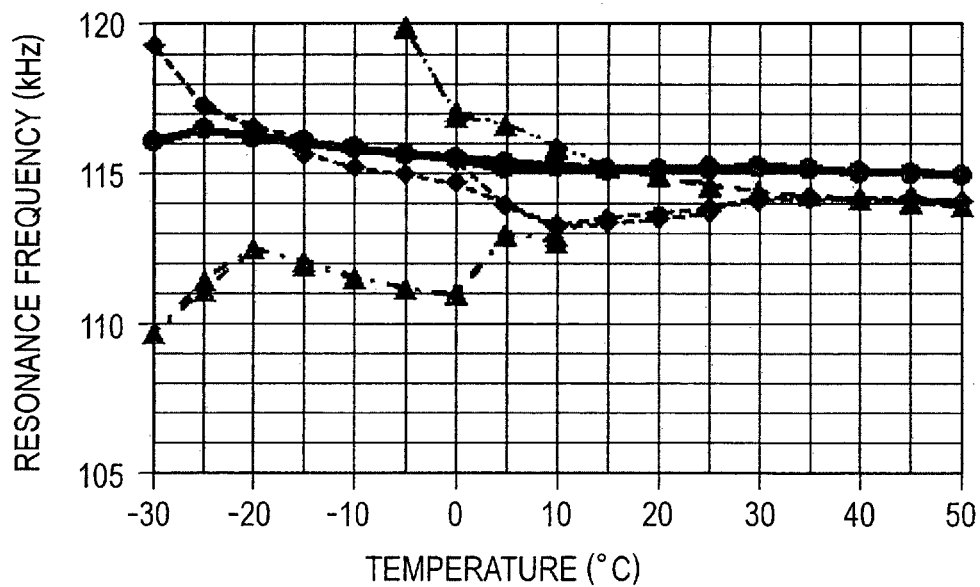
FIG. 18 is a graph showing temperature dependence of a resonance frequency of image pickup units including dust removing devices of Example 31 and Comparative Examples 3 and 4.
Figure 19:
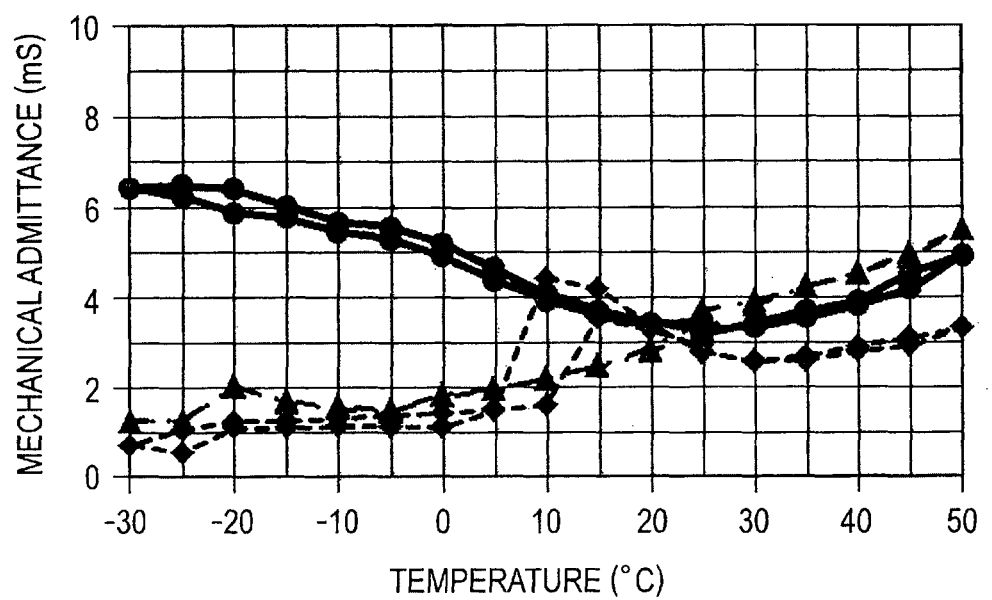
FIG. 19 is a graph showing temperature dependence of a mechanical admittance of the image pickup units including the dust removing devices of Example 31 and Comparative Examples 3 and 4.

FIGS. 18 and 19 are respectively graphs showing a change in resonance frequency and mechanical admittance of the image pickup-units including the dust removing devices of Example 31 and Comparative Examples 3 and 4 with respect to temperature. Solid circles connected by a solid line represent a result of the image pickup unit including the dust removing device of Example 31, diamond marks connected by a dotted line represents a result of the image pickup unit including the dust removing device of Comparative Example 3, and triangles connected by an alternate long and short dash line represents a result of the image pickup unit including the dust removing device of Comparative Example 4. FIGS. 18 and 19 both show measurement results obtained by starting the measurement at 30° C. and changing the temperature in the order of an increase, a decrease, and an increase to 30° C. The measurement was performed in a constant temperature reservoir. The constant temperature reservoir was held at each temperature for a predetermined period of time, and after the temperature became stable, a resonance frequency and a mechanical admittance at each temperature were evaluated.

As is understood from FIG. 18, in a temperature range of −30° C. to 50° C. at least in which a dust removing device actually provided at an image pickup unit needs to have high dust removal performance, a change in resonance frequency in the dust removing device of Comparative Example 3 was 6.5 kHz, and a change in resonance frequency in the dust removing device of Comparative Example 4 was at least 10.5 kHz or more, whereas in the dust removing device of Example 31 of the present invention, the dust removing device established resonance within a frequency change of 1.5 kHz. In the image pickup unit including the dust removing device of Comparative Example 4 represented by the triangles connected by an alternate long and short dash line, by removing dust at 0° C. or lower through use of a vibration mode different from that at 0° C. or higher, the dust removing device actually established resonance within a frequency change of 7.5 kHz to remove dust.

Further, as is understood from FIG. 19, in a temperature range of −30° C. to 50° C. at least in which a dust removing device actually provided at an image pickup unit needs to have high dust removal performance, in the dust removing devices of Comparative Examples 3 and 4, about 1.0 mS was the smallest mechanical admittance in the temperature range, whereas in the dust removing device of Example 31 of the present invention, about 3.0 mS was the smallest mechanical admittance in the temperature range.

Further, in the image pickup units including the dust removing devices of the comparative examples, the mechanical admittance became smallest at 0° C. or lower, whereas in the image pickup unit including the dust removing device of Example 31 of the present invention, the mechanical admittance did not become smallest at 0° C. or lower.

Examples 32 to 57

Image pickup units including the dust removing devices of Examples 32 to 57 as illustrated in FIG. 10 were produced through use of the piezoelectric materials of Production Examples 2 to 27 by the same method as that of Example 31.

Examples 58 and 59

Image pickup units including the dust removing devices of Examples 58 and 59 as illustrated in FIG. 10 were produced through use of the piezoelectric materials of Production Examples 28 and 29 by the same method as that of Example 31, except for placing a piezoelectric element in silicon oil and polarizing the piezoelectric element at a temperature of 120° C., an application electric field of 4 kV/mm, and a voltage application time of 30 minutes.

Example 60

An image pickup unit including the dust removing device of Example 60 as illustrated in FIG. 10 was produced through use of the piezoelectric material of Production Example 30 by the same method as that of Example 31, except for performing polarization at a temperature of 100° C., an application electric field of 1 kV/mm, and a voltage application time of 30 minutes.

(Evaluation of Dust Removal Performance of Image Pickup Units Including Dust Removing Devices of Examples 32 to 60)

Next, a mechanical admittance and a resonance frequency of image pickup units including the dust removing devices of Examples 32 to 60 were measured. As a result, the mechanical admittance and the resonance frequency were values as shown in Table 3. The image pickup units including the dust removing devices of Examples 58 to 60 had a smaller change in resonance frequency and satisfactory characteristics compared with the comparative examples.

TABLE 3

|  |  | Change in resonance frequency [kHz] | Minimum value of mechanical admittance [mS] |
|---|---|---|---|
| Example 31 | Production Example 1 | 1.5 | 3.1 |
| Example 32 | Production Example 2 | 1.4 | 2.5 |
| Example 33 | Production Example 3 | 1.5 | 2.8 |
| Example 34 | Production Example 4 | 2.8 | 2.2 |
| Example 35 | Production Example 5 | 1.2 | 3.0 |
| Example 36 | Production Example 6 | 1.5 | 2.4 |
| Example 37 | Production Example 7 | 3.2 | 3.8 |
| Example 38 | Production Example 8 | 3.5 | 3.7 |
| Example 39 | Production Example 9 | 3.5 | 3.8 |
| Example 40 | Production Example 10 | 1.5 | 2.9 |
| Example 41 | Production Example 11 | 2.8 | 3.7 |
| Example 42 | Production Example 12 | 1.9 | 1.8 |
| Example 43 | Production Example 13 | 2.6 | 3.6 |
| Example 44 | Production Example 14 | 1.5 | 3.0 |

TABLE 3-continued

|  |  | Change in resonance frequency [kHz] | Minimum value of mechanical admittance [mS] |
|---|---|---|---|
| Example 45 | Production Example 15 | 1.4 | 2.9 |
| Example 46 | Production Example 16 | 3.9 | 2.6 |
| Example 47 | Production Example 17 | 3.0 | 1.9 |
| Example 48 | Production Example 18 | 2.1 | 3.4 |
| Example 49 | Production Example 19 | 1.5 | 3.0 |
| Example 50 | Production Example 20 | 1.5 | 2.8 |
| Example 51 | Production Example 21 | 1.5 | 3.1 |
| Example 52 | Production Example 22 | 1.5 | 2.7 |
| Example 53 | Production Example 23 | 2.8 | 2.0 |
| Example 54 | Production Example 24 | 3.0 | 3.6 |
| Example 55 | Production Example 25 | 2.0 | 3.6 |
| Example 56 | Production Example 26 | 1.4 | 2.5 |
| Example 57 | Production Example 27 | 1.3 | 2.4 |
| Example 58 | Production Example 28 | 2.5 | 0.9 |
| Example 59 | Production Example 29 | 1.5 | 0.6 |
| Example 60 | Production Example 30 | 3.5 | 1.2 |
| Comparative Example 3 | Comparative Production Example 1 | 6.5 | 0.5 |
| Comparative Example 4 | Comparative Production Example 2 | 10.5 | 1.0 |

Examples 61 and 62

Image pickup units including the dust removing devices of Examples 61 and 62 as illustrated in FIG. 10 were produced through use of the piezoelectric material of Production Example 1 by the same method as that of Example 31, except that a material for a sealing member was different. A silicone rubber sheet was used as the sealing member in Example 61, and a styrene-butadiene rubber sheet was used as the sealing member of Example 62. In this case, a storage elastic modulus G' of the silicone rubber sheet evaluated through dynamic viscoelastic analysis (DMA) was 4 MPa at −5° C. and 3 MPa at 25° C. Further, a storage elastic modulus G' of the styrene-butadiene rubber sheet was 6 MPa at −5° C. and 4 MPa at 25° C.

(Evaluation of Dust Removal Performance of Image Pickup Units Including Dust Removing Devices of Examples 61 and 62)

Next, a mechanical admittance and a resonance frequency of image pickup units including the dust removing devices of Examples 61 and 62 were measured. A measurement frequency was set in a range of 105 to 120 kHZ, and the measurement was performed in increments of 5° C. in the order of 25° C. to 50° C. to −30° C. to 25° C. in a range of −30° C. to 50° C. An in-phase alternating electric field was applied to the right and left piezoelectric elements as well as the image pickup units including the dust removing devices of Examples 61 and 62, and the nineteenth standing wave vibration mode was formed on the diaphragm in the above-mentioned frequency range.

Change widths of resonance frequencies of the image pickup units including the dust removing devices of Examples 61 and 62 were both less than 4 kHz. Further, mechanical admittances of the image pickup units tended to increase along with a decrease in temperature, and a value of the smallest mechanical admittance was 2 mS or more.

(Evaluation of Dust Removal Performance)

The dust removal performance of the image pickup units including the dust removing devices of Example 31 and Comparative Example 4 were evaluated. Various kinds of plastic beads for evaluating a dust removal rate were scattered onto the surface of a diaphragm of each image pickup unit including the dust removing device, and the dust removal rate on the diaphragm after an elapse of a predetermined period of time was evaluated. A frequency range of 105 to 120 kHz was swept for 0.5 seconds while applying an in-phase alternating electric field of 30 Vp-p to the right and left piezoelectric elements, and then, a frequency range of 100 to 115 kHz was swept for 0.5 seconds while applying an alternative electric field of reverse phases of 30 Vp-p. In the above-mentioned frequency ranges, the nineteenth and eighteenth standing wave vibration modes were formed successively on the diaphragm. Evaluation was performed with the temperature of the surface of the diaphragm set to −30° C., −5° C., 25° C., and 50° C.

Table 4 shows an evaluation result of the dust removal performance of Example 31, and Table 5 shows an evaluation result of the dust removal performance of Comparative Example 4. The results proved that the dust removing device of the present invention exhibits a sufficiently high dust removal rate even when a voltage is applied from a power supply included in, for example, a digital camera main body.

TABLE 4

| Temperature ° C. | Beads 1 | Beads 2 | Beads 3 | Beads 4 |
|---|---|---|---|---|
| −30 | 100% | 100% | 100% | 100% |
| −5 | 100% | 100% | 100% | 100% |
| 25 | 99% | 98% | 99% | 98% |
| 50 | 99% | 98% | 99% | 98% |

TABLE 5

| Temperature ° C. | Beads 1 | Beads 2 | Beads 3 | Beads 4 |
|---|---|---|---|---|
| −30 | 94% | 94% | 95% | 93% |
| −5 | 95% | 94% | 95% | 94% |
| 25 | 99% | 98% | 99% | 98% |
| 50 | 99% | 98% | 99% | 98% |

(Note)
Beads 1: polystyrene of 10 to 100 μm in particle diameter
Beads 2: polymethylmethacrylate of 10 to 100 μm in particle diameter
Beads 3: silica of 10 to 100 μm in particle diameter
Beads 4: a mixture of the beads 1, the beads 2, and the beads 3

INDUSTRIAL APPLICABILITY

The dust removing device of the present invention is capable of excellently removing dust adhering to a surface, and hence may be applied to various imaging devices such as an image pickup element, a digital camera main body, a video digital camera, a copying machine, a facsimile machine, and a scanner or electrical and electronic equipment including the imaging device, in particular, equipment in which dust adhering to a surface of an optical component needs to be removed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-060202, filed Mar. 16, 2012, Japanese Patent Application No. 2011-230368, filed Oct. 20, 2011, Japanese Patent Application No. 2012-177562, filed Aug. 9, 2012, and Japanese Patent Application No. 2012-188984, filed Aug. 29, 2012 which are hereby incorporated by reference herein in their entirety.

REFERENCE SIGNS LIST 1 camera main body
2 mount portion
5 mirror box
6 main mirror
200 shutter unit
300 main body chassis
400 image pickup unit
410 diaphragm
420 flexible printed board
430 piezoelectric element
431 piezoelectric material
432 first electrode
433 second electrode
434 polarization direction
435 electric field direction
436 first electrode surface
437 second electrode surface
440 adhesion member
450 sealing member
460 pushing member
470 dust removing device
500 image pickup element unit
501 base
510 image pickup element holding member
520 circuit board
530 shield case
540 light shielding member
550 optical low-pass filter holding member
560 optical low-pass filter
570 image pickup element

The invention claimed is:

1. A dust removing device comprising:
a piezoelectric element comprising a piezoelectric material and a pair of opposing electrodes;
a vibration member; and
a fixation member containing at least a high molecular compound component,
wherein a phase transition temperature T from a first ferroelectric crystal phase to a second ferroelectric crystal phase of the piezoelectric material is $-60°\text{C.} \leq T \leq -5°\text{C.}$, and
wherein a modulus of elasticity at 25° C. of the fixation member is smaller than a modulus elasticity at $-5°$ C. of the fixation member.

2. The dust removing device according to claim 1, wherein the fixation member comprises an elastomer.

3. The dust removing device according to claim 1, wherein the fixation member comprises a foamed resin.

4. The dust removing device according to claim 1, wherein the fixation member is thermoplastic.

5. The dust removing device according to claim 1, wherein the first ferroelectric crystal phase of the piezoelectric material comprises a tetragonal phase.

6. The dust removing device according to claim 1, wherein the second ferroelectric crystal phase of the piezoelectric material comprises an orthorhombic phase.

7. The dust removing device according to claim 1, wherein the piezoelectric material has a lead content of less than 1,000 ppm.

8. The dust removing device according to claim 1, wherein the piezoelectric material comprises piezoelectric ceramics containing barium titanate as a main component.

9. The dust removing device according to claim 1, wherein the piezoelectric material comprises, as a main component, a perovskite-type metal oxide represented by general formula (1):

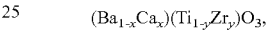

$(Ba_{1-x}Ca_x)(Ti_{1-y}Zr_y)O_3$, where $0.02 \leq x \leq 0.30$, $0.020 \leq y \leq 0.095$, and $y \leq x$.

10. The dust removing device according to claim 9, wherein the piezoelectric material comprises an Mn component, and a content of the Mn component is from 0.02 parts by weight to 0.40 parts by weight with respect to 100 parts by weight of the perovskite-type metal oxide.

11. The dust removing device according to claim 1, wherein the piezoelectric element and the vibration member have a plate shape, one electrode surface of the piezoelectric element is fixedly bonded to a plate surface of the vibration member, and the vibration member is fixed to a base through an intermediation of the fixation member.

12. The dust removing device according to claim 1, comprising multiple piezoelectric elements.

13. The dust removing device according to claim 1, wherein the vibration member comprises an optical material.

14. An imaging device comprising the dust removing device according to claim 1 and an image pickup element unit, wherein the vibration member of the dust removing device and a light receiving surface of the image pickup element unit are provided coaxially in this order.

* * * * *